United States Patent
Shinriki et al.

(10) Patent No.: US 7,383,841 B2
(45) Date of Patent: Jun. 10, 2008

(54) METHOD OF CLEANING SUBSTRATE-PROCESSING DEVICE AND SUBSTRATE-PROCESSING DEVICE

(75) Inventors: Hiroshi Shinriki, Nirasaki (JP); Kazuya Dobashi, Nirasaki (JP); Mikio Suzuki, Nirasaki (JP); Takashi Magara, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 491 days.

(21) Appl. No.: 10/519,401

(22) PCT Filed: Jul. 1, 2003

(86) PCT No.: PCT/JP03/08317

§ 371 (c)(1),
(2), (4) Date: Jan. 4, 2005

(87) PCT Pub. No.: WO2004/006316

PCT Pub. Date: Jan. 15, 2004

(65) Prior Publication Data

US 2006/0175011 A1    Aug. 10, 2006

(30) Foreign Application Priority Data

Jul. 5, 2002  (JP) .............................. 2002-197365
Dec. 10, 2002 (JP) .............................. 2002-357945

(51) Int. Cl.
*B08B 3/00* (2006.01)
*B08B 9/00* (2006.01)

(52) U.S. Cl. ................. 134/22.1; 134/10; 134/19; 134/105; 134/166 R; 216/58; 156/345.29

(58) Field of Classification Search .............. 134/10, 134/19, 22.1, 105, 166 R, 902; 216/58; 156/345.29
See application file for complete search history.

(56) References Cited

U.S. PATENT DOCUMENTS 5,294,262 A * 3/1994 Nishimura ................. 134/22.1
2005/0139234 A1* 6/2005 Dobashi et al. ............... 134/19

FOREIGN PATENT DOCUMENTS

| JP | 10-321528 | * 12/1998 |
| JP | 2001-131753 | * 5/2001 |
| JP | 2001-176807 | * 6/2001 |

* cited by examiner

*Primary Examiner*—Zeinab E EL-Arini
(74) *Attorney, Agent, or Firm*—Oblon, Spivak, McClelland, Maier & Neustadt, P.C.

(57) ABSTRACT

In a cleaning step of a substrate-processing device, vacuum drawing is made for the space between an inner chamber and an outer chamber that receives the inner chamber. Temperature of the inner chamber is set higher than the temperature of the inner chamber during substrate processing and set lower than the temperature of a substrate support member. After that, a cleaning gas containing hexafluoroacetylaceton (Hhfac) is supplied in the inner chamber, and substances to be cleaned off adhering inside the inner chamber are removed.

22 Claims, 19 Drawing Sheets

METHOD OF CLEANING SUBSTRATE-PROCESSING DEVICE AND SUBSTRATE-PROCESSING DEVICE

FIELD OF THE INVENTION

The present invention relates to a method of cleaning substrate-processing apparatus which performs a process on a substrate, and the substrate-processing apparatus to which a cleaning may be performed.

BACKGROUND OF THE INVENTION

Conventionally, as a film forming apparatus to form a film on a surface of a semiconductor substrate, e.g., a silicon wafer (hereinafter, referred to as wafer for simplicity), there has been known the film forming apparatus which forms a film chemically (refer to Japanese Patent Laid-Open Application No. 2002-151489). However, when the film is formed on the wafer continuously by using the film forming apparatus above-described, there is a problem that a deposit which is adhered to an inner wall of the chamber, a susceptor installed in the chamber and the like is separated from the inner wall of the chamber and the susceptor, thereby polluting the wafer.

Consequently, it is needed to clean the film forming apparatus periodically. However, there are still the drawbacks that conditions for the cleaning are not established such that the cleaning thereof is not performed efficiently.

DETAILED DESCRIPTION OF THE INVENTION

Therefore, the present invention has been made to ameliorate the above-described disadvantages. In other words, it is an object of the present invention to provide a method of cleaning substrate-processing apparatus which performs a process on a substrate, and the substrate-processing apparatus to which a cleaning process may be performed.

A method of cleaning a substrate processing apparatus in accordance with the present invention, the method includes the steps of: after processing a substrate placed in an inner chamber of a substrate processing apparatus, elevating a temperature of the inner chamber higher than that when processing thereof; exhausting a space between the inner chamber and an outer chamber that accommodates the inner chamber; supplying a cleaning gas into the inner chamber; and removing substances to be cleaned off which are adhered to an inside of the inner chamber, while cooling the outer chamber. The cleaning method of the substrate-processing apparatus in accordance with the present invention includes the cleaning steps described above, so that the cleaning can be performed efficiently. Further, because the cleaning thereof is performed after exhausting the space between the inner chamber and the outer chamber, a temperature of the outer chamber may be prevented from elevated. By performing the cleaning thereof while cooling the outer chamber, a temperature of the outer chamber can be prevented from being elevated.

The outer chamber is preferably made of metals. By making the outer chamber of metals, a mechanical strength of the substrate-processing apparatus can be increased. Further, this facilitates the maintenance of a vacuumed status.

The cleaning method thereof is preferably performed by spreading a cleaning gas along a surface of a substrate supporting member which supports the substrate accommodated into the inner chamber. By supplying the cleaning gas thereto, a ratio of the cleaning gas colliding with the substrate supporting member may be increased, compared with a case of supplying the cleaning gas toward the substrate supporting member from upside of the substrate supporting member, thereby capable of removing a lot more substances to be cleaned off from the substrate-supporting member.

The above-described cleaning gas preferably includes ketone. By including ketone in the cleaning gas, the substances to be cleaned off in the inner chamber can be removed from the inside of the inner chamber or the chamber.

Another method for cleaning a substrate-processing apparatus in accordance with the present invention, the method includes the steps of: after processing a substrate placed in an inner chamber of a substrate processing apparatus, elevating temperatures of a chamber and a substrate-supporting member higher than those when processing thereof, respectively; supplying a cleaning gas having ketone; and removing substances to be cleaned off which are adhered to an inside of the inner chamber. The cleaning method of the substrate-processing apparatus in accordance with the present invention includes the above-described cleaning steps, thereby capable of performing the cleaning of the substrate-processing apparatus efficiently.

The cleaning steps are preferably performed by spreading a cleaning gas along a surface of a substrate-supporting member. By supplying the cleaning gas thereto like this, a ratio of the cleaning gas colliding with the substrate-supporting member may be increased, compared with that for a case of supplying the cleaning gas toward the substrate-supporting member from upside of the substrate-supporting member, thereby capable of removing a lot more substances to be cleaned off from the substrate-supporting member.

The above-described cleaning gas preferably includes ketone. By including ketone in the cleaning gas, the substances to be cleaned off in the inner chamber can be removed from the inside of the inner chamber or the chamber.

Still another method for cleaning a substrate-processing apparatus in accordance with the present invention, the method includes the steps of: after processing a substrate placed in an inner chamber of a substrate processing apparatus, elevating a temperature of the chamber higher than that during the processing of the substrate; supplying a cleaning gas having Ketone; and removing substances to be cleaned off which are adhered to an inside of the inner chamber. The cleaning method of the substrate-processing apparatus in accordance with the present invention includes the above-described cleaning steps, thereby capable of performing the cleaning of the substrate-processing apparatus efficiently.

The cleaning steps are preferably performed by spreading a cleaning gas along a surface of a substrate-supporting member. By supplying the cleaning gas thereto like this, a ratio of the cleaning gas colliding with the substrate-supporting member may be increased, compared with that for a case of supplying the cleaning gas toward the substrate-supporting member from upside of the substrate-supporting member, thereby capable of removing a lot more substances to be cleaned off from the substrate-supporting member.

The above-described ketone is preferably β-diketone. By using β-diketone as ketone, there can be formed a complex of the substances which constitutes the substances to be cleaned off. Further, among β-diketones, hexafluoroacetylaceton is preferable.

The above-described cleaning steps are preferably performed in a state that a temperature of the inner chamber or a chamber is higher than that of the inner chamber or a chamber when processing a substrate by more than or equal to 100° C. By performing the cleaning steps under an above-described state, the substances to be cleaned off can be securely removed therefrom.

The above-described inner chamber or the chamber is preferably made of quartz or ceramics. By manufacturing the inner chamber or the chamber with the above-described substances, it is possible to heat the inner chamber or the chamber up to a highly elevated temperature.

The above-described substances to be cleaned off may be an oxide including at least one element selected from the group consisting of Al, Y, Zr, Hf, La, Ce and Pr. For the case that such oxides are deposited to the inner chamber or the chamber, the oxide can be securely removed from the inside of the inner chamber or the chamber. The cleaning gas preferably includes active species. The active species of the present invention includes a radical and an ion. By including the active species in the cleaning gas, the substances to be cleaned off can be removed from the inner chamber or the chamber.

The above-described cleaning process is preferably performed, while exhausting the inside of the inner chamber or the chamber. By exhausting the inside of the inner chamber or the chamber during the cleaning steps, it is possible to complete the cleaning in a short time.

The above-described exhaust from the inside of the inner chamber or the chamber is preferably performed by using an independent gas exhaust unit other than that used during the processing of the substrate. By executing the exhaust as described above, it may be possible to prevent by-products, etc. from being adhered into the gas exhaust unit which is used during the processing of the substrate, the by-products being generated by a chemical reaction between the substances to be cleaned off and the cleaning gas.

It is preferable to perform the above-described exhaust of the inside of the inner chamber or the chamber, while collecting the by-products which have been generated by a chemical reaction between the substances to be cleaned off and the cleaning gas. By performing the exhaust thereof while collecting the by-products, it is possible to prevent the by-products from being adhered into the gas exhaust unit which is used when cleaning thereof.

The collection of the above-described by-products is preferably performed at a place close to the inner chamber or the chamber. By performing the collection at the places described above, it is possible to further prevent the by-products from being adhered into the gas exhaust unit which is used when cleaning thereof.

The above-described inner chamber or the chamber may be heated up by a resistance heating element. By employing the resistance heating element, it is possible to readily heat the inner chamber or the chamber to a predetermined temperature.

The above-described inner chamber or the chamber may be heated up by a heating lamp. By using the heating lamp, it is possible to elevate the temperature of the inner chamber or the chamber to a predetermined level in a short time.

A substrate-processing apparatus in accordance with the present invention includes: an inner chamber; an outer chamber accommodating the inner chamber therein; a cleaning gas supplying unit for providing a cleaning gas to an inside of the inner chamber; a chamber heater for heating the inner chamber, installed between the inner chamber and the outer chamber; and an exhaust unit for exhausting a space between the inner chamber and the outer chamber. The substrate-processing apparatus in accordance with the present invention includes the cleaning gas supplying unit, the chamber heater and the exhaust unit, thereby capable of cleaning an inside of the inner chamber. By installing the chamber heater at the position described above, the inner chamber can be securely heated. Further, since the space between the inner chamber and the outer chamber is exhausted, the heat from the chamber heater is prevented from being easily transferred to the outer chamber, thereby securely preventing the temperature of the outer chamber from being elevated.

The above-described substrate-processing apparatus preferably further includes a reflecting body which guides a heat ray into the inner chamber, the heat ray being irradiated from the chamber heater. By including the reflecting body, the inner chamber can be efficiently heated.

Another substrate-processing apparatus in accordance with the present invention includes: an inner chamber; an outer chamber which is made of metals and accommodates the inner chamber; a cleaning gas supplying unit for providing a cleaning gas to an inside of the inner chamber; a chamber heater for heating the inner chamber; and an exhaust unit for exhausting a space between the inner chamber and the outer chamber. The substrate-processing apparatus in accordance with the present invention includes the cleaning gas supplying unit, the chamber heater and the exhaust unit, thereby capable of cleaning an inside of the inner chamber. Further, by making the outer chamber of metals, it can be increased a mechanical strength of the substrate-processing apparatus, furthermore, thereby rendering it facilitated to maintain a vacuumed status.

Still another substrate-processing apparatus in accordance with the present invention includes: an inner chamber; an outer chamber accommodating the inner chamber; a cleaning gas supplying unit for providing a cleaning gas to an inside of the inner chamber; a chamber heater for heating the inner chamber; an exhaust unit for exhausting a space between the inner chamber and the outer chamber; a cooling unit for cooling the outer chamber, being installed to the outer chamber. The substrate-processing apparatus in accordance with the present invention includes the cleaning gas supplying unit, the chamber heater and the exhaust unit, thereby capable of cleaning an inside of the inner chamber. Provided with the cooling unit, the temperature of the outer chamber can be securely prevented from being elevated.

BEST MODE FOR CARRYING OUT THE INVENTION

Embodiments

First Embodiment

Figure 1:
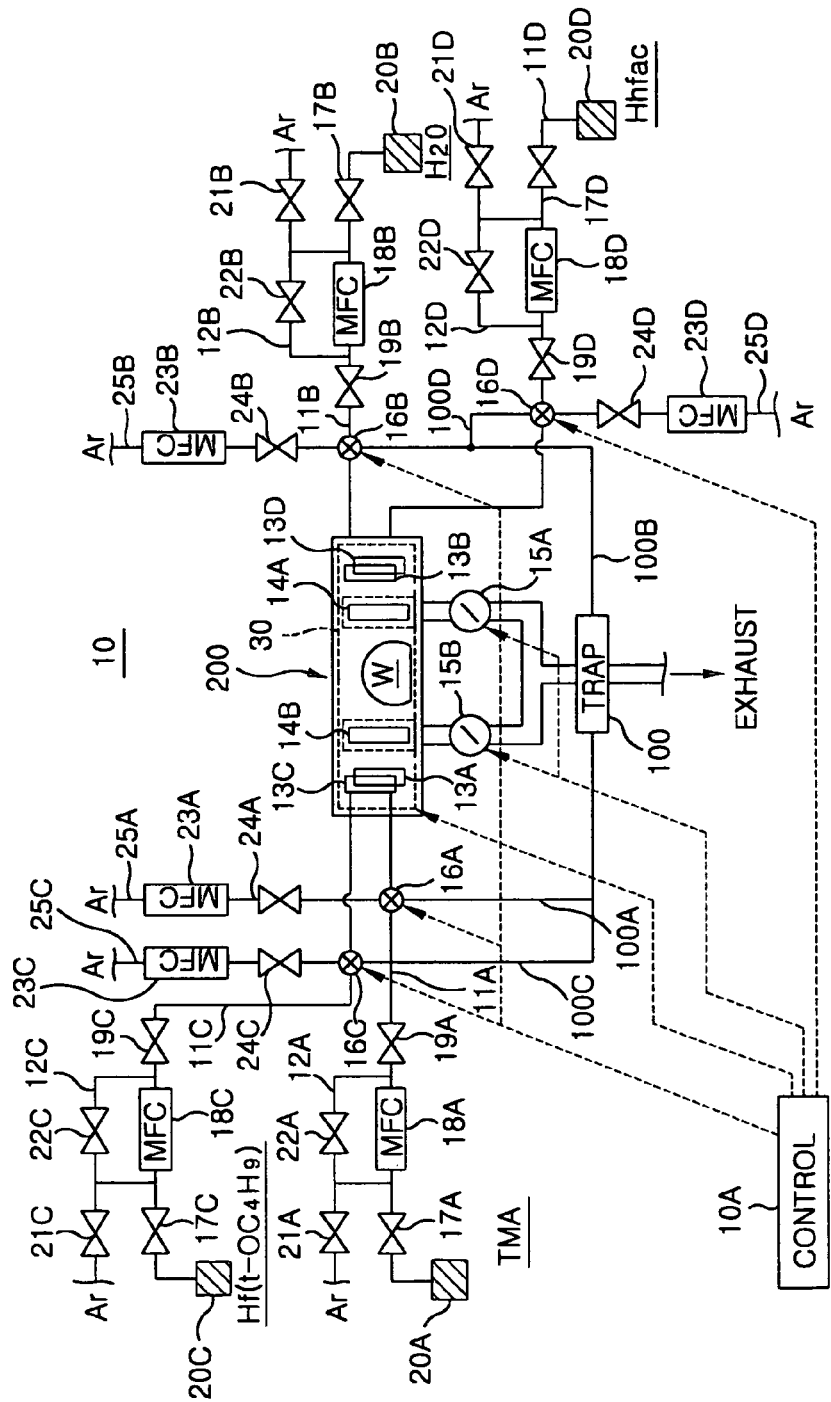
FIG. 1 shows a structure of a substrate-processing apparatus in accordance with a first embodiment of the present invention.

Hereinafter, the present invention is described in accordance with a first embodiment. FIG. 1 shows a structure of a substrate-processing apparatus which performs an ALD (Atomic Layer Deposition) film forming process in accordance with the first embodiment of the present embodiment.

In the ALD film forming process, a first source gas and a second source gas are supplied thereto in the form of a laminar flow which flows along a surface of the wafer, making a source gas molecule in the first source gas be absorbed onto the surface of the wafer. By reacting this source gas molecule with a source gas molecule in the second source gas, a film having a thickness of one layer of molecule is formed. By repeating the above-described process, there is formed a high quality dielectric constant film, especially a high dielectric constant film which can be used as an insulating film on the surface of the wafer.

As shown in FIG. 1, a substrate-processing apparatus 10 includes a processing vessel 200 which has processing gas inlet openings 13A and 13B facing each other, a wafer W being located in between thereof, and gas exhaust ports 14A and 14B having a shape of a slim and long slit, each of gas exhaust ports facing a different one of processing gas inlet openings 13A and 13B.

Each of the gas exhaust ports 14A and 14B is connected to a trap 100 via conductance valves 15A and 15B, respectively. A gas in the processing vessel 200 is exhausted through the trap 100. Further, in the processing vessel 200, there is formed a processing gas inlet opening 13C installed together with the processing gas inlet opening 13A.

The processing gas inlet opening 13A is connected to a first outlet of a switching valve 16A. The switching valve 16A is connected to a source vessel 20A which stores tri-methyle aluminum $(CH_3)_3Al$ (hereinafter, referred to as TMA) via a first source supply line 11A which has a valve 17A, a mass flow rate controller 18A and a separate valve 19A. The first source supply line 11A is connected to a purge line 12A including valves 21A, 22A to supply an inert gas such as Ar.

The switching valve 16A is connected to a valve purge line 25A which is connected to a source of the inert gas such as Ar, the valve purge line 25A including a mass flow rate controller 23A and a valve 24A. A second outlet of the switching valve 16A is connected to the trap 100 via a purge line 100A.

Similarly, a processing gas inlet opening 13B is connected to a first outlet of a switching valve 16B. The switching valve 16B is connected to a source vessel 20B which stores $H_2O$ via a second source supply line 11B which has a valve 17B, a mass flow rate controller 18B and a separate valve 19B. The second source supply line 11B is connected to a purge line 12B including valves 21B, 22B to supply an inert gas such as Ar.

The switching valve 16B is connected to a valve purge line 25B which is connected to a source of the inert gas such as Ar, the valve purge line having a mass flow rate controller 23B and a valve 24B. A second outlet of the switching valve 16B is connected to the trap 100 via a purge line 100B.

A processing gas inlet opening 13C is connected to a first outlet of a switching valve 16C. The switching valve 16C is connected to a source vessel 20C which stores $Hf(t-OC_4H_9)_4$ via a third source supply line 11C which has a valve 17C, a mass flow rate controller 18C and a separate valve 19C. The third source supply line 11C is connected to a purge line 12C having valves 21C, 22C to supply an inert gas such as Ar.

The switching valve 16C is connected to a valve purge line 25C which is connected to a source of the inert gas such as Ar, the valve purge line 25C having a mass flow rate controller 23C and a valve 24C. A second outlet of the switching valve 16C is connected to the trap 100 via a purge line 100C.

In the processing vessel 200, a cleaning gas inlet opening 13D is parallel installed to a gas exhaust port 14A. The cleaning gas inlet opening 13D is connected to a first outlet of a switching valve 16D. The switching valve 16D is connected to a source vessel 20D which stores hexafluoro-acetylaceton (hereinafter, referred to as Hhfac) via a fourth source supply line 11D which has a valve 17D, a mass flow rate controller 18D and a separate valve 19D. The forth source supply line 11D is connected to a purge line 12D having valves 21D, 22D to supply an inert gas such as Ar.

The switching valve 16D is connected to a valve purge line 25D which is connected to a source of the inert gas such as Ar and has a mass flow rate controller 23D and a valve 24D. A second outlet of the switching valve 16D is connected to the trap 100 via purge lines 100D, 100B.

In the substrate-processing apparatus 10, there is installed a controlling apparatus 10A which controls a film forming process. The controlling apparatus 10A controls the switching valves 16A, 16B, 16C, 16D, conductance valves 15A, 15B and a chamber heater 220 which will be described later. Further, an optical sensor which will be described later is electrically connected to the controlling apparatus 10A.

Figure 2:
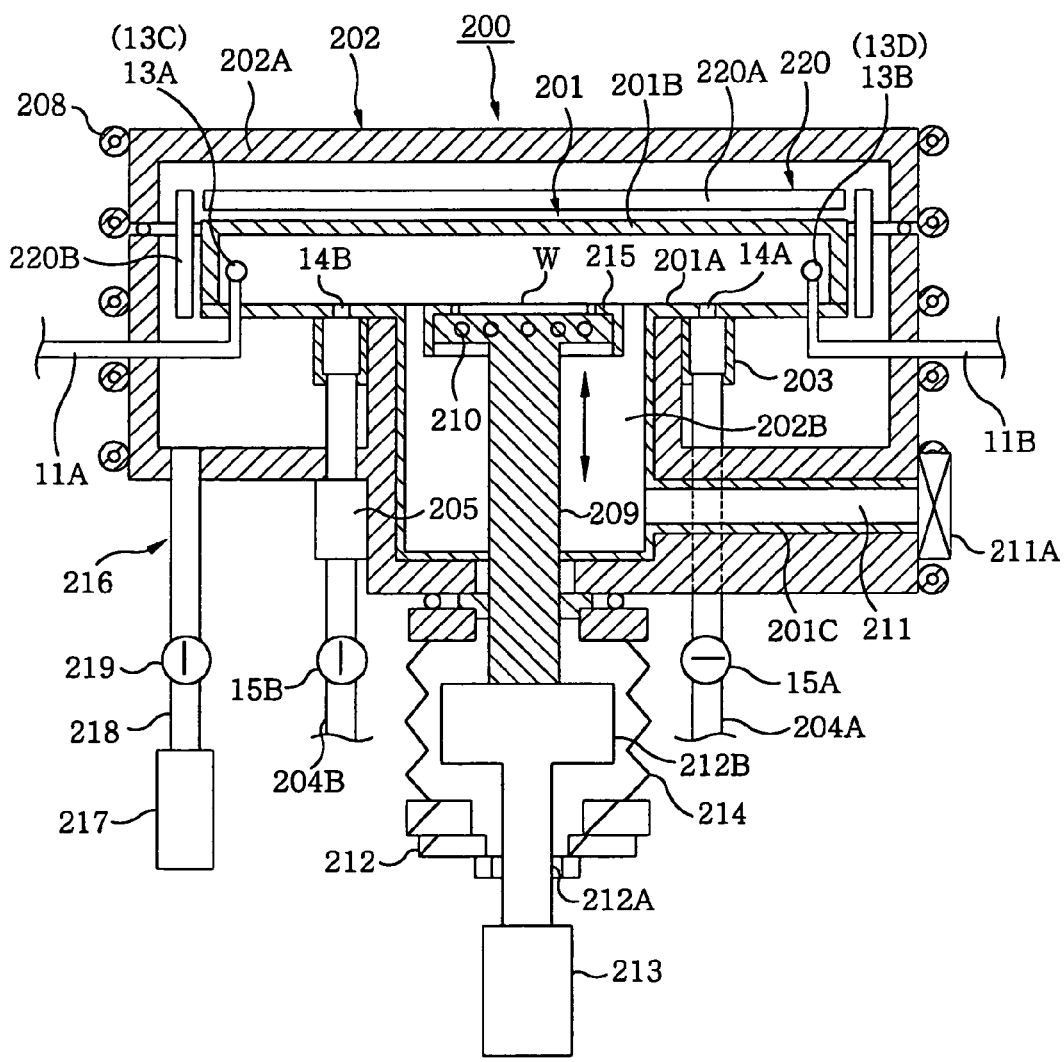
FIG. 2 presents an inside of a processing vessel schematically in accordance with the first embodiment of the present invention.

FIG. 2 shows an inside of the processing vessel 200 schematically in accordance with the present embodiment. In FIG. 2, identical reference numerals are given to the corresponding part of FIG. 1. As shown in FIG. 2, the processing vessel 200 includes an inner chamber 201 made of a quartz glass and an outer chamber 202 made of Al, the outer chamber being installed outside of the inner chamber 201.

The inner chamber 201 is fixed inside the outer chamber 202 and accommodated in a recessed portion which is covered with a cover plate 202A, a constituent part of the outer chamber 202. The inner chamber 201 includes a quartz lower plate 201A covering a lower surface of the outer chamber 202 in the recessed portion and a quartz cover 201B covering the quartz lower plate 201A in the recessed portion.

In the inner chamber 201, the processing gas inlet openings 13A and 13B are installed facing each other, the wafer W being located in between thereof. At the quartz lower plate 201A, there are formed the gas exhaust ports 14A, 14B to exhaust an inside of the inner chamber 201. Herein, TMA which is introduced from the processing gas inlet opening 13A flows along a surface of the wafer W and is exhausted from the gas exhaust port 14A facing thereto. Similarly, $H_2O$ which is introduced from the processing gas inlet opening 13B flows along the surface of the wafer W and is exhausted from the gas exhaust port 14B facing thereto. By flowing TMA and $H_2O$ alternatively from the processing gas inlet opening 13A to the gas exhaust port 14A or from the processing gas inlet opening 13B to the gas exhaust port 14B, respectively, it becomes possible to form a film having a thickness of molecular layer as a basis unit, which is described previously.

In a peripheral of the gas exhaust ports 14A, 14B, there is installed a liner 203 made of a quartz glass. Further, each of exhausting pipes 204A, 204B linked with a depressurization pump that is not shown is connected to the liner 203. Furthermore, conductance valves 15A, 15B are provided to exhausting pipes 204A, 204B, respectively.

Referring to FIG. 2, the conductance valve 15A is set up to be in a closed state and the conductance valve 15B is set up to be in an open state, approximately. To implement a highly reliable opening/closing state, the conductance valves 15A, 15B are preferably left to be opened by about 3%, rather than closing thereof completely.

Between the conductance valve 15B of the exhausting pipe 204B and the outer chamber 202, there is installed a trap 205 separately from a trap 100. By the trap 205, there may be removed particles and impurities such as a liquefied component and/or a solid component that are contained in an exhaust, at a position immediately behind a place where they are discharged from the inner chamber 201. Further, the trap 205 may be omitted therefrom.

In the outer chamber 202, formed is a window not shown which is made of the quartz glass. Outside of the outer chamber 202, installed are a lamp 215 for irradiating a ray to a guard ring 215 which will be described later through the window and an optical sensor which is not shown for measuring strength of the ray which is reflected from the guard ring 215. By irradiating the ray to the guard ring 215 and measuring the strength of the ray which is reflected from the guard ring 215, an amount of $Al_2O_3$ deposited to a susceptor 209 may be seized.

At a peripheral of the outer chamber 202, there is installed a water cooling jacket 208 for cooling the outer chamber 202. By the flowing of cooling water in the water cooling jacket 208, the outer chamber 202 is cooled down. Further, without being limited to the water cooling jacket 208, a cooling apparatus which is capable of cooling the outer chamber 202 may be used therein. As the cooling apparatus, a peltier component can be exemplified other than the cooling jacket 208.

A circularly shaped opening 202B is formed at a lower portion of the outer chamber 202. In the opening 202B, there is accommodated a disc shaped supporting table i.e., the susceptor 209, which supports the wafer W. In the susceptor 209, there is accommodated a heating unit, e.g., a resistance heating typed heater 210.

The susceptor 209 can be rotatble by a substrate transferring portion 211 which is provided at a lower portion of the outer chamber 202 and simultaneously maintained therein to be movable up and down. The susceptor 209 is maintained to be movable upward and downward between a top level of a process position and a bottom level of a substrate loading/unloading position, and the process position is determined so that the surface of the wafer W on the susceptor 209 is approximately coincided with the surface of the quartz plate 201A.

Meanwhile, the substrate loading/unloading position is set up correspondently to a gate valve 211A that is formed on a sidewall surface of the substrate transferring portion 211. For the case that the susceptor 209 is lowered to the substrate loading/unloading position, a transfer arm which is not shown is inserted therein from the gate valve 211A, the wafer W which is lifted from a surface of the susceptor 209 by a lift pin (not shown) is pulled out and delivered to a next process. Further, the transfer arm which is not shown introduces a new wafer W into the substrate transferring portion 211 via the gate valve 211A, and loads the wafer on the susceptor 209. The susceptor 209 accommodating the new wafer W is provided therein in a rotatable way by a revolving axis 212B which is maintained by a magnetic seal 212A in a bearing 212, further, being provided therein in a vertically movable way by an air cylinder 213 which is provided from an extension of the revolving axis 212B. A space where the revolving axis 212B ascends and/or descends is sealed by a partition wall such as a bellows 214. At this time, the space is exhausted through an exhaust port which is not shown, thereby maintaining a higher level of vacuum degree than the inside of the inner chamber 201. Consequently, it may be avoided a pollution to the substrate processing process which is performed in the inner chamber 201.

Furthermore, to perform such differential pressure exhaust securely, there is provided a guard ring 215 made of a quartz glass to surround the wafer W on the susceptor 209. By the guard ring 215, the conductance is suppressed between the susceptor 209 and the side wall surface of the opening 202B. Accordingly, the difference in pressure from the inner chamber 201 is ensured when a space formed by the bellows 214 is securely exhausted to a high vacuum level.

A side wall surface of an opening 202B which is formed at a lower portion of the outer chamber 202 is covered with a liner 201C. The liner 201C is extended to the lower portion and covering an inner wall of the substrate transferring portion 211.

A space is formed between the inner chamber 201 and the outer chamber 202. A gas exhaust unit 216, which lowers a pressure of the space by exhausting thereof, is connected to the outer chamber 202. The gas exhaust unit 216 includes a depressurization pump 217, a gas exhausting pipe 218 which is connected to the depressurization pump 217 and the outer chamber 202, and a conductance valve 219 which adjusts a pressure in the outer chamber 202. In a state that the conductance valve 219 is opened, the depressurization pump 217 operates, thereby lowering the pressure of the space.

In a space between the inner chamber 201 and the outer chamber 202, there is installed a chamber heater 220. Specifically, the chamber heater 220A is installed in a space between an upper portion of a quartz cover 201B and a cover plate 202A. Moreover, the chamber heater 220B is installed in a space between a side portion of the quartz cover 201B and a side portion of the outer chamber 202.

The chamber heaters 220A, 220B are installed at a place close to an outside of the quartz cover 201B. The chamber heaters 220A, 220B are apparatuses for heating the inner chamber 201 from outside thereof and connected to a controller 10A electrically. The chamber heaters 220A, 220B can be controlled an on/off of a heating and/or an output power thereof based on a command from the controller 10A.

For the chamber heaters 220A, 220B, any type of heater which can heat the inside of the inner chamber 201 up to more than or equal to 350° C. will be sufficient. For example, there may be employed a previously known heater, e.g., a resistance heating typed heater which dissipates heat by an electrical resistance during energization of power, a lamp heating typed heater which is made of, e.g., an infrared lamp, and a ceramic heater. The chamber heaters 220A, 220B may be built inside the quartz cover 201B. Further, the chamber heater 220B may be omitted therefrom.

Figure 3:
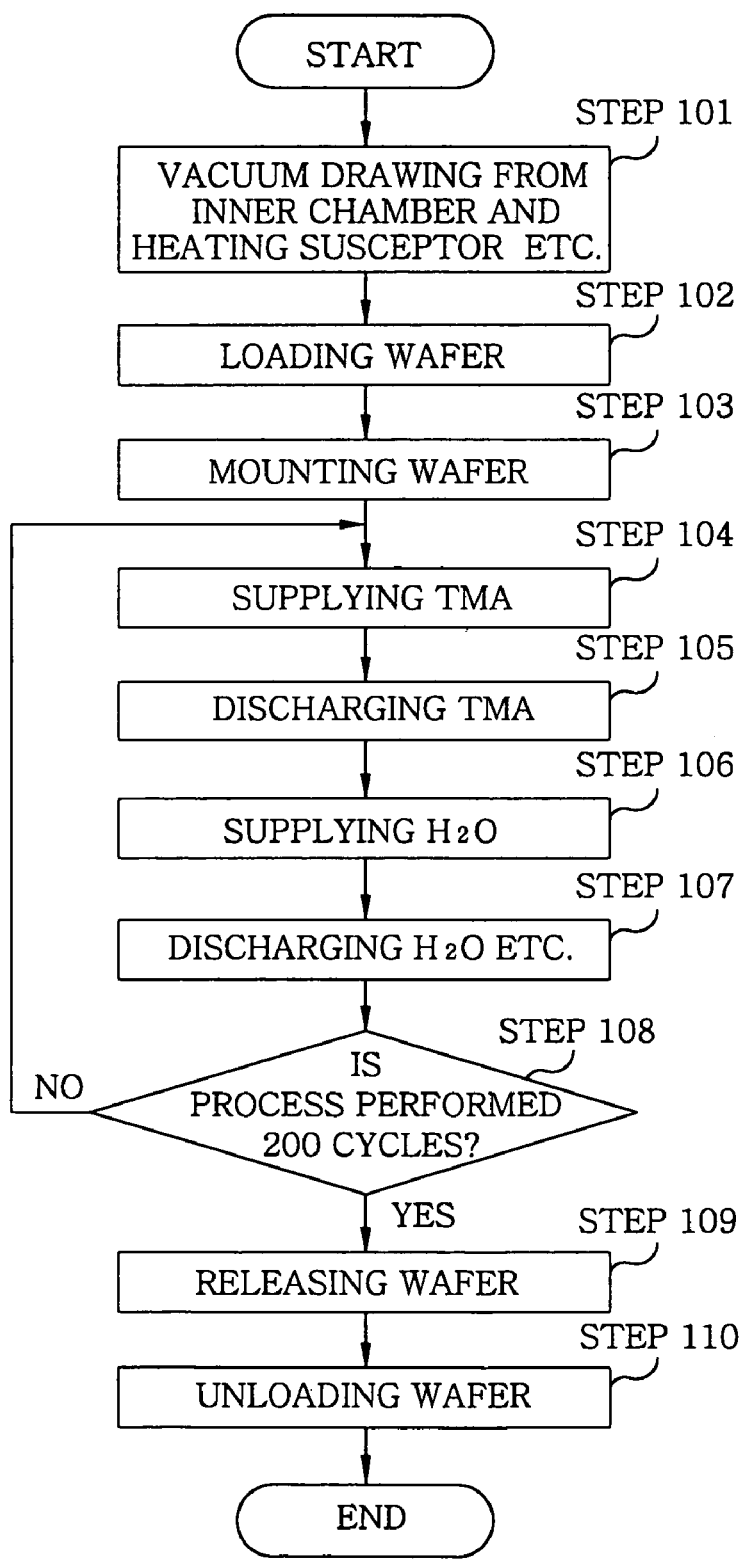
FIG. 3 illustrates a flow chart of film-forming which is performed by the substrate-processing apparatus in accordance with the first embodiment of the present invention.

Hereinafter, a flow of film-forming which is performed in the substrate-processing apparatus 10 will be described with reference to FIG. 3. FIG. 3 is a flow chart which shows a flow of the film-forming which is performed in the substrate-processing apparatus 10.

First, a vacuum drawing from the inner chamber 201 is performed by operating the depressurization pump which is not shown. Further, an electrical current flows through the heater 210 and the chamber heater 220, so that the inner chamber 201 is heated to about 150° C. and the susceptor 209 is heated to about 300° C. (step 101).

A pressure in the inner chamber 201 is lowered to a predetermined pressure and simultaneously the susceptor 209 and the inner chamber 201 reach a predetermined temperature, and next a gate valve 211A is opened, the transfer arm which is not shown holding the wafer W extends, and the wafer W is loaded into the inner chamber 201 (step 102).

Next, by retracting the transfer arm, the wafer W is loaded on a lift pin which is not shown. After loading the wafer W on the wafer lift pin, the wafer lift pin is lowered and the wafer W is loaded on the susceptor 209 (step 103).

After the inner chamber 201 is stabilized at a temperature of about 150° C. and the susceptor 209 is stabilized at a temperature of about 300° C., the valves 17A, 19A, the switching valve 16A are opened such to supply TMA into the inner chamber 201 at a flow rate of about 30 sccm while the pressure in the inner chamber 201 is maintained at between about 50 Pa and about 400 Pa (step 104). The TMA provided thereto flows along the surface of the wafer W. Herein, if the TMA contacts with the surface of the wafer W, the TMA is absorbed on the surface of the wafer W.

After a predetermined time has elapsed, the valves 17A, 19A, the switching valve 16A are closed, supplying of the TMA is stopped and simultaneously the TMA remaining in the inner chamber 201 is exhausted from the inside of the inner chamber 201 (step 105). Further, during exhausting thereof, the pressure of the inner chamber 201 is maintained at about $1.33 \times 10^{-2}$ Pa.

After a predetermined time has elapsed, the valves 17B, 19B, the switching valve 16B are opened and $H_2O$ is supplied into the inner chamber 201 at a flow rate of about 100 sccm (step 106). The $H_2O$ supplied thereto flows along the surface of the wafer W. Herein, if the $H_2O$ contacts with the TMA which is absorbed to the wafer W, an $Al_2O_3$ film is formed on the wafer W by the reaction between TMA and $H_2O$.

After a predetermined time has elapsed, the switching valve 16B, the valves 19B, 17B are closed, supplying of the $H_2O$ is stopped and then $H_2O$ etc. which remains in the inner chamber 201 is exhausted from the inside of the inner chamber 201 (step 107). Further, during exhausting thereof, the pressure in the inner chamber 201 is maintained at about $1.33 \times 10^{-2}$ Pa.

After a predetermined time has elapsed, having process from the step 104 through the step 107 as one cycle, the controller 10A determines if the designed number of cycles is reached. In the preferred embodiment, the process is set up to be finished at 200 cycles (step 108). If the process is determined to be performed less than 200 cycles, the process from the step 104 through the step 107 is repeated.

If the process is determined to be performed 200 cycles, a wafer pin which is not shown is lifted and the wafer W becomes distant from the susceptor 209 (step 109). Further, if the process is performed 200 cycles, an $Al_2O_3$ film of thickness of about 20 nm is formed on the wafer W.

Next, after the gate valve 211A is opened, the transfer arm which is not shown extends and the wafer W is held in the transfer arm. Finally, the transfer arm retracts and the wafer W is unloaded from the inner chamber 201 (step 110).

Figure 4:
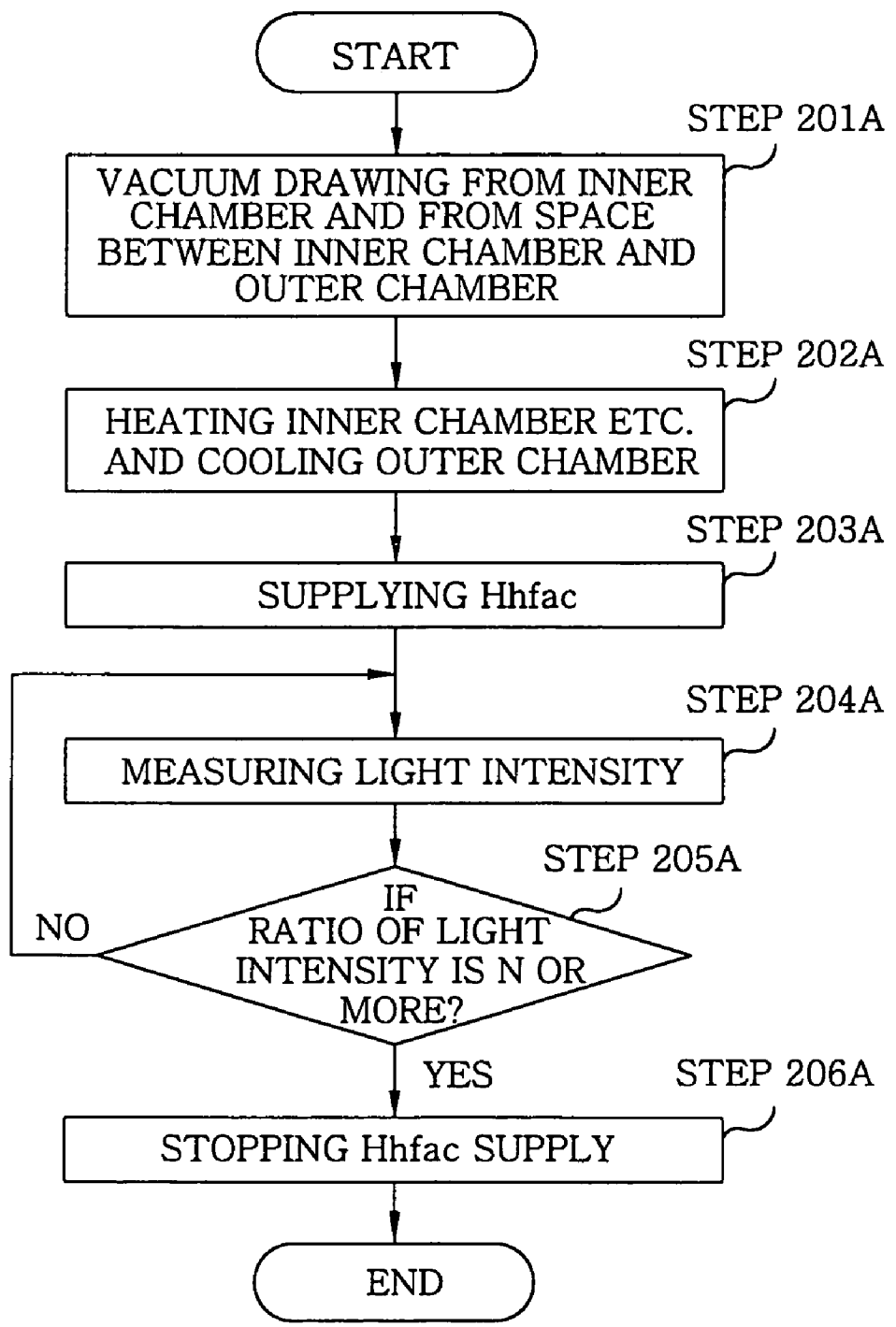
FIG. 4 depicts a flow chart of cleaning which is performed by the substrate-processing apparatus in accordance with a first embodiment of the present invention.
Figure 5A:
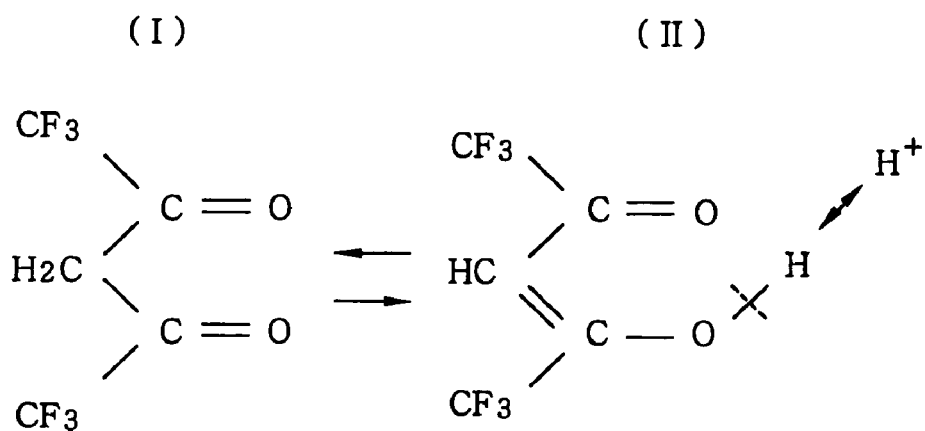
FIG. 5A illustrates a chemical structure of Hhfac schematically.
Figure 5B:
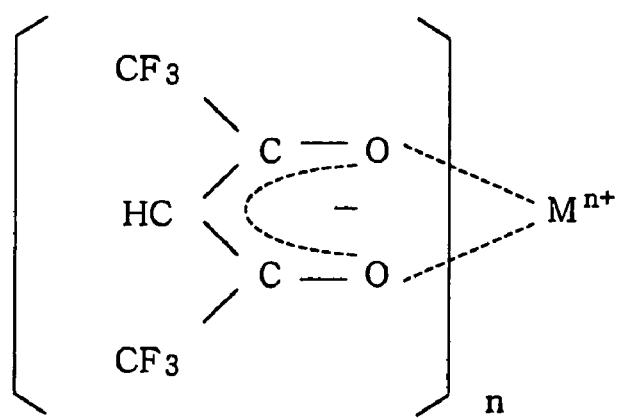
FIG. 5B represents a chemical structure of a metal complex which is formed by Hhfac schematically.

Hereinafter, a flow of cleaning which is performed in the substrate-processing apparatus 10 will be described with reference to FIGS. 4 and 5. FIG. 4 shows a flow of cleaning which is performed by the substrate-processing apparatus 10 in accordance with the present embodiment. FIG. 5A illustrates a chemical structure of Hhfac schematically and FIG. 5B represents a chemical structure of a metal complex formed by Hhfac schematically.

First, a vacuum drawing is performed from the inner chamber 201 via the exhausting pipe 204B by operating the depressurization pump which is not shown. Further, there is performed the vacuum drawing from the space between the inner chamber 201 and the outer chamber 202 by operating the depressurization pump 217 (step 201A).

Next, an electrical current flows into the chamber heaters 220A, 220B and the heater 210, the inner chamber 201 is heated to about 350° C. and the susceptor 209 is heated to about 400° C. Additionally, the outer chamber 202 is cooled down by flowing the cooling water into the water-cooling jacket 208 (step 202A). Further, the inner chamber 201 is heated to about 150° C. and the susceptor 209 is heated to about 300° C. during film-forming, and accordingly the temperatures of the inner chamber 201 and the susceptor 209 during cleaning is higher than those of the inner chamber 201 and the susceptor 209 during film-forming by more than 100° C. Further, the inner chamber 201 may be heated over or equal to about 350° C. and the susceptor 209 may be heated over or equal to about 400° C., additionally over or equal to about 450° C.

After the pressure in the inner chamber 201 is maintained ay about between $9.31 \times 10^3$ and $1.33 \times 10^4$ Pa, the inner chamber is heated to about 350° C. and the susceptor is heated to about 400° C., Hhfac is supplied into the inner chamber 201 at a flow rate ranging from about 320 sccm to about 380 sccm by opening the valves 17D, 19D and the switching valve 16D (step 203A). By supplying the Hhfac into the inner chamber 201, the cleaning in the inner chamber 201 is performed. Specifically, if the Hhfac is supplied into the inner chamber 201, the Hhfac mainly flows along the surface of the susceptor 209. When Hhfac contacts with $Al_2O_3$ adhered to the inner chamber 201 and the susceptor 209, Hhfac reacts with $Al_2O_3$ chemically, thereby forming an Al complex. A reaction mechanism is as follows. The β-diketone such as Hhfac has a tautomerism. Accordingly, as shown in FIG. 5A, the Hhfac can be either, a structure I or a structure II. Consequently, a shared electrons between C=O binding and C—C binding becomes delocalized. Accordingly, O—H binding of the structure II can be separated easily. If there is a positively charged atom such as a metal atom M near the Hhfac, it is thought that Hhfac, of which the O—H bonding having the above described structure II is loosened, is coordinated, thereby forming the metal complex as shown in FIG. 5B. Accordingly, it is thought that the metal complex, which is formed by coordinating a plurality of Hhfac's to metal atom M, is easily removed from the inner chamber 201 by exhausting thereof, because of a high vapor pressure. Further, it is thought that any β-diketone, without being limited to the Hhfac, may cause the reaction described above. Furthermore, the Al complex which is exhausted from the inner chamber 201 is seized by the trap 205.

It is preferable that Hhfac is supplied into the inner chamber 201 together with $O_2$, $N_2$ and $H_2O$. In this case, $O_2$, $N_2$ is preferably supplied thereto at the flow rates ranging from 50 sccm to 250 sccm, ranging from 100 sccm to 300 sccm, respectively and $H_2O$ is preferably supplied thereto with a concentration less than or equal to 2000 ppm.

Next, during the cleaning process, a lamp which is not shown is lit on and simultaneously the intensity of the light being reflected from the guard ring 215 is measured by an optical sensor which is also not shown. (step 204A)

An information on the light intensity which is measured by the optical sensor is delivered to the controller 10A and a ratio of the light intensity which has been measured during the cleaning process to an light intensity stored in the controller 10A is calculated and then a calculated result is compared with a predetermined number N. (step 205A)

If the calculated result is less than the predetermined number N, a control signal is delivered to the optical sensor from the controller 10A and the light intensity is measured repeatedly. If the calculated result is more than or equal to the predetermined number N, the control signal from the controller 10A is delivered to the switching valve 16D etc. and the valves 17D, 19D and the switching valve 16D are closed (step 206A). Accordingly, the cleaning in the inner chamber 201 is completed.

In the present embodiment, Hhfac is supplied into the inner chamber 201 in a state that the inner chamber 201 is maintained at an elevated temperature which is higher than the temperature of the film-forming such that $Al_2O_3$ which is adhered to the inner wall of the inner chamber 201 and the susceptor 209 can be removed efficiently.

In the present embodiment, the space between the inner chamber 201 and the outer chamber 202 is exhausted and a pressure thereof is made to be lower than an atmospheric pressure such that the outer chamber 202 may be prevented from being softened. In other words, the chamber is generally made of Al. Meanwhile, Al does not show a good heat resistance property. Accordingly, if the chamber which is made of Al is heated upto more than or equal to 250° C., the chamber may have a possibility to be softened. Therefore, the space between the inner chamber 201 and the outer chamber 202 is exhausted and a pressure thereof is made to be lower than the atmosphere. Accordingly, the heat which is irradiated from the chamber heaters 220A, 220B is difficult to be transferred to the outer chamber 202. Consequently, a temperature of the outer chamber 202 can be prevented from being elevated, thereby being capable of hindering the outer chamber 202 from being softened.

In the present embodiment, when heating the inner chamber 201, the space between the inner chamber 201 and the outer chamber 202 is exhausted and a pressure thereof is made to be lower than the atmospheric pressure so that a heating efficiency of the inner chamber 201 can be improved. In other words, the space between the inner chamber 201 and the outer chamber 202 is exhausted and a pressure thereof is made to be lower than the atmospheric pressure, thereby capable of preventing a heat from being dissipated from the inner chamber 201. Therefore, the heating efficiency of the inner chamber 201 can be improved.

In the present embodiment, when heating the inner chamber 201, the outer chamber 202 is cooled down, thereby being capable of further preventing the temperature of the outer chamber 202 from being elevated.

In the present embodiment, although the cleaning is performed in the state that the temperature of the inner chamber 201 is lower than that of the susceptor 209, $Al_2O_3$ which is adhered to the inner chamber 201 can still be effectively removed. In other words, the film-forming is performed in the state that the temperature of the susceptor is higher than that of the chamber. Meanwhile, the film formed at the higher temperature becomes denser than that formed at the lower temperature. Accordingly, $Al_2O_3$ which is adhered to the susceptor 209 becomes denser than $Al_2O_3$ which is adhered to the inner chamber 201. Herein, $Al_2O_3$ which is not dense tends to be cleaned more easily than $Al_2O_3$ which is dense. Therefore, even for the case of performing the cleaning in the state that the temperature of the inner chamber 201 is lower than that of the susceptor 209, $Al_2O_3$ which is adhered to the inner chamber 201 can be efficiently removed.

In the present embodiment, Hhfac is supplied along the surface of the susceptor 209 and accordingly, there can be increased the ratio of Hhfac which collides with the susceptor 209 compared with a method of supplying the Hhfac by, e.g., a shower head from an upside of the susceptor 209, thereby capable of removing more of $Al_2O_3$ from the susceptor 209.

In the present embodiment, intensity of light is measured and an end point of the cleaning is determined based on the measurement result, so that the cleaning can be performed in accordance with an adhering status of a deposit. Consequently, there can be prevented an insufficient cleaning or a waste of the cleaning gas by an excessive cleaning. Further, the excessive cleaning can be prevented, thereby improving the throughput thereof. Furthermore, the lamp and the optical sensor can be omitted therefrom. For such a case, the end point of the cleaning may be determined based on a film thickness, after finding the accumulated film thickness in advance.

Embodiment 1

Hereinafter, an embodiment 1 will be described. In the present embodiment, there investigated about an optimum temperature of the inner chamber and the susceptor, when cleaning the substrate-processing apparatus to which $Al_2O_3$ adhered. Further, during film-forming of $Al_2O_3$, the inner chamber had been heated to about 150° C. and the susceptor had been heated to about 300° C.

There will be explained on measurement conditions. In the present embodiment, as a substrate-processing apparatus, there was used the substrate-processing apparatus explained in the first embodiment. Herein, the substrate-processing apparatus to which $Al_2O_3$ adhered was not cleaned by the cleaning gas, however, $Al_2O_3$ film on the wafer was etched by the cleaning gas. As the $Al_2O_3$ film, the film formed by heating the wafer to about 300° C. and the film formed by heating the wafer to about 150° C. were used. A cleaning gas composed of Hhfac and $O_2$ was used. Flow rates of Hhfac and $O_2$ were 375 sccm and 100 sccm, respectively. Further, a concentration of $H_2O$ in the cleaning gas was 0 ppm. Furthermore, the pressure in the inner chamber was about $1.13 \times 10^4$ Pa. Such a state was maintained while the $Al_2O_3$ film was etched by changing the temperature of the wafer.

Figure 6:
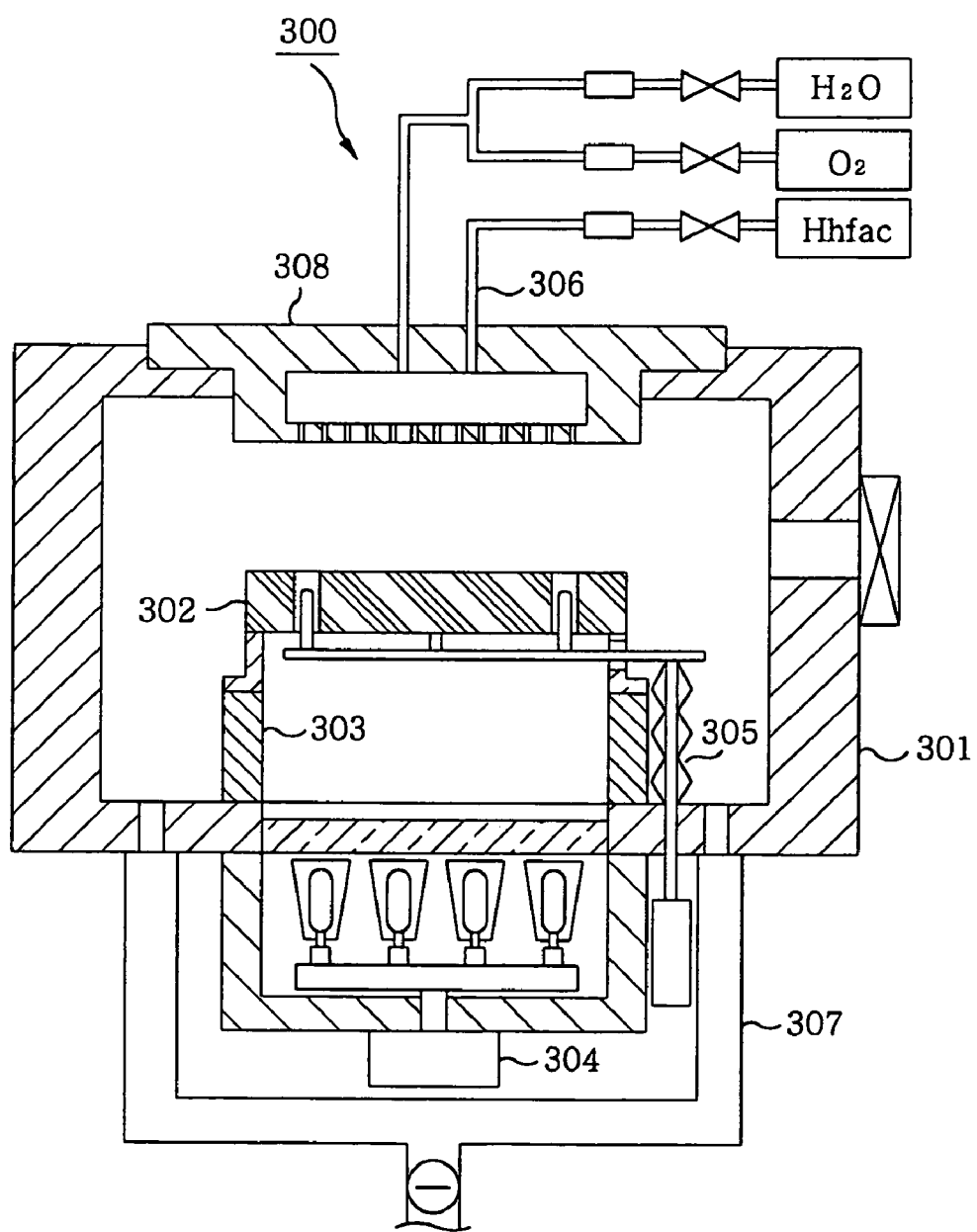
FIG. 6 represents a figure of a substrate-processing apparatus in accordance with a comparative example.

For a comparison with the present embodiment, as a comparison example, a same etching was performed by using a substrate-processing apparatus different from the substrate-processing apparatus used in the present embodiment. FIG. 6 shows the substrate-processing apparatus in accordance with the comparative example, schematically.

As shown in FIG. 6, the substrate-processing apparatus 300 used in the comparative example, mainly includes a chamber 301 which accommodates the wafer, a susceptor 302 for loading the wafer, a susceptor supporting member 303 for supporting the susceptor 302, a susceptor heating unit 304 for heating the susceptor 302, an wafer elevating mechanism 305 for loading the wafer on the susceptor 302 or for unloading the wafer from the susceptor, a cleaning gas supply system 306 for supplying a cleaning gas into a chamber 301, a gas exhaust unit 307 for exhausting an inside of the chamber 301 and a shower head 308 for discharging the cleaning gas. Herein, the shower head 308 is installed facing the susceptor 302 so that the cleaning gas which is discharged from the shower head flows vertically against an upper surface of the susceptor 302, approximately. Further, as an $Al_2O_3$ film, the film formed by heating the wafer to about 150° C. was used. Further, components of the cleaning gas and a pressure in the chamber, etc. were identical to those of the present embodiment.

Figure 7:
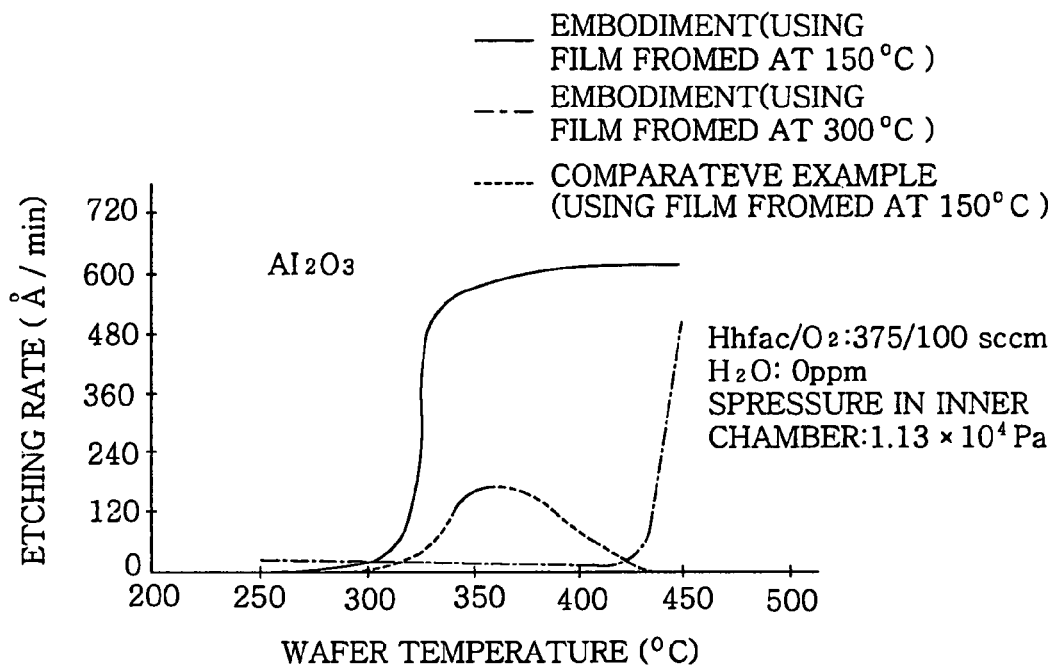
FIG. 7 shows a graph illustrating a relation between a wafer temperature and an etching rate of an $Al_2O_3$ film in accordance with an embodiment 1.

Analyses of the measurement results are as follows. FIG. 7 is a graph which illustrates a relation between a temperature of the wafer and an etching rate of an $Al_2O_3$ film in accordance with the comparative example and the present embodiment. As shown by the graph of FIG. 7, a high etching rate may be achieved for the case that the temperature of the wafer is equal to or higher than 350° C., when the etching is performed to the $Al_2O_3$ film which is formed at about 150° C. in accordance with the present embodiment. Meanwhile, a high etching rate may be achieved for the case that the temperature of the wafer is equal to or higher than 400° C., when the etching is performed to the $Al_2O_3$ film which is formed at about 300° C. in accordance with the present embodiment.

Resultantly, when cleaning the substrate-processing apparatus to which the $Al_2O_3$ film is adhered in accordance with the present embodiment, it is thought that the inner chamber is heated to preferably higher than or equal to 350° C. and the susceptor is heated to preferably higher than or equal to about 400° C.

Furthermore, as shown by the graph of FIG. 7, it is verified that, for the etching of the $Al_2O_3$ film which is formed at about 150° C. in accordance with the present embodiment, a peak value of the etching rate is, although it is not confirmed, clearly higher than a peak value of the etching rate for the etching of the $Al_2O_3$ film which is formed at about 150° C. in accordance with the comparative example. It is probably because more gas molecule collides with the wafer when the cleaning gas is supplied parallel to the wafer, compared with when the cleaning gas is supplied to the wafer perpendicularly.

Resultantly, it is more preferable to use the substrate-processing apparatus in accordance with the present embodiment than to use the substrate-processing apparatus of the comparative example.

Embodiment 2

Hereinafter, an embodiment 2 will be described. In the embodiment 2, when cleaning the substrate-processing apparatus to which $HfO_2$ adhered, there investigated about an optimum temperature of the inner chamber and the susceptor. Further, during film-forming of $HfO_2$, the inner chamber had been heated to about 150° C. and the susceptor had been heated to about 300° C.

There will be explained on measurement conditions. In the present embodiment, as a substrate-processing apparatus, there was used the substrate-processing apparatus explained in the first embodiment. Herein, the substrate-processing apparatus to which $HfO_2$ adhered was not cleaned by the cleaning gas however an $HfO_2$ film on the wafer was etched by the cleaning gas. As the $HfO_2$ film, the film formed by heating the wafer to about 150° C. and the film formed by heating the wafer to about 300° C. were used. A cleaning gas composed of Hhfac and $O_2$ was used. Flow rates of Hhfac and $O_2$ were 375 sccm and 100 sccm, respectively. Further, a concentration of $H_2O$ in the cleaning gas was 0 ppm. Furthermore, the pressure in the inner chamber was about $1.13 \times 10^4$ Pa. Such a state was maintained while the $HfO_2$ film was etched by changing the temperature of the wafer.

For a comparison with the present embodiment, as a comparative example, a same etching was performed by using a substrate-processing apparatus different from the substrate-processing apparatus used in the present embodiment. There was used the substrate-processing apparatus of the comparative example identical to that explained in the embodiment 1. Further, as the $HfO_2$ film, the film formed by heating the wafer to about 150° C. was used. Furthermore, components of the cleaning gas and a pressure in the chamber, etc. were identical to those of the present embodiment.

Figure 8:
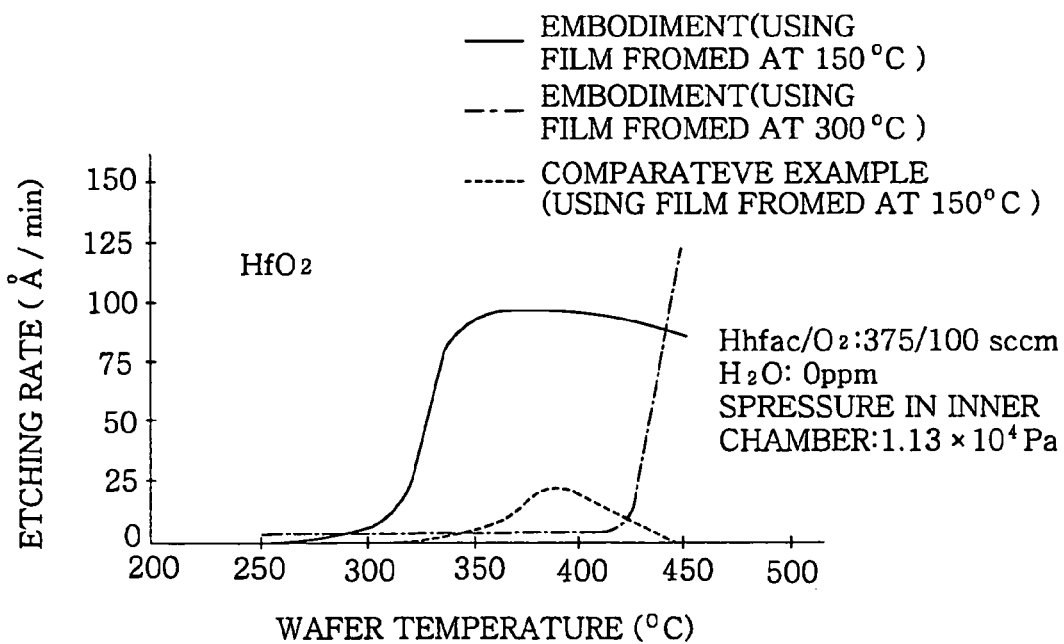
FIG. 8 illustrates a graph illustrating a relation between a wafer temperature and an etching rate of an $HfO_2$ film in accordance with an embodiment 2.

There will be described on the measurement results. FIG. 8 is a graph which illustrates a relation between a temperature of the wafer and an etching rate of the $HfO_2$ film in accordance with the present embodiment. As shown by the graph of FIG. 8, a high etching rate may be achieved for the case that the temperature of the wafer is equal to or higher than 350° C., when the etching is performed to the $HfO_2$ film which is formed at about 150° C. in accordance with the present embodiment. Meanwhile, a high etching rate may be achieved for the case that the temperature of the wafer is equal to or higher than 400° C., when the etching is performed to the $HfO_2$ film which is formed at about 300° C. in accordance with the present embodiment.

Resultantly, when cleaning the substrate-processing apparatus to which the $HfO_2$ film is adhered in accordance with the present embodiment, it is thought to be preferable that the inner chamber is heated to higher than or equal to 350° C. and the susceptor is heated to higher than or equal to 400° C.

Furthermore, as known by the graph of FIG. 8, it is verified that, for the etching of the $HfO_2$ film which is formed at about 150° C. in accordance with the present embodiment, a peak value of the etching rate is clearly higher than a peak value of the etching rate for the etching of the $HfO_2$ film which is formed at about 150° C. in accordance with the comparative example. It is thought that this is caused by the same reason which is explained for the embodiment 1.

Resultantly, it is thought to be more preferable to use the substrate-processing apparatus in accordance with the present embodiment than to use the substrate-processing apparatus of the comparative example.

Embodiment 3

Hereinafter, an embodiment 3 will be described. In the embodiment 3, when cleaning the substrate-processing apparatus to which $HfO_2$ adhered, there investigated about an optimum pressure in the inner chamber. Further, during film-forming of $HfO_2$, the inner chamber had been heated to about 150° C. and the susceptor had been heated to about 300° C.

There will be explained on measurement conditions. In the present embodiment, as a substrate-processing apparatus, there was used the substrate-processing apparatus explained in the first embodiment. Herein, the substrate-processing apparatus to which $HfO_2$ adhered was not cleaned by the cleaning gas however $HfO_2$ film on the wafer was etched by the cleaning gas. For the $HfO_2$ film, the film formed by heating the wafer to about 150° C. and the film formed by heating the wafer to about 300° C. were used. A cleaning gas including Hhfac and $O_2$ was used. Flow rates of Hhfac and $O_2$ were 375 sccm and 100 sccm, respectively. Further, a concentration of $H_2O$ in the cleaning gas was 0 ppm. Furthermore, the temperature of the inner chamber was about 450° C. Such a state was maintained while the $HfO_2$ film was etched by changing the pressure in the wafer.

Figure 9:
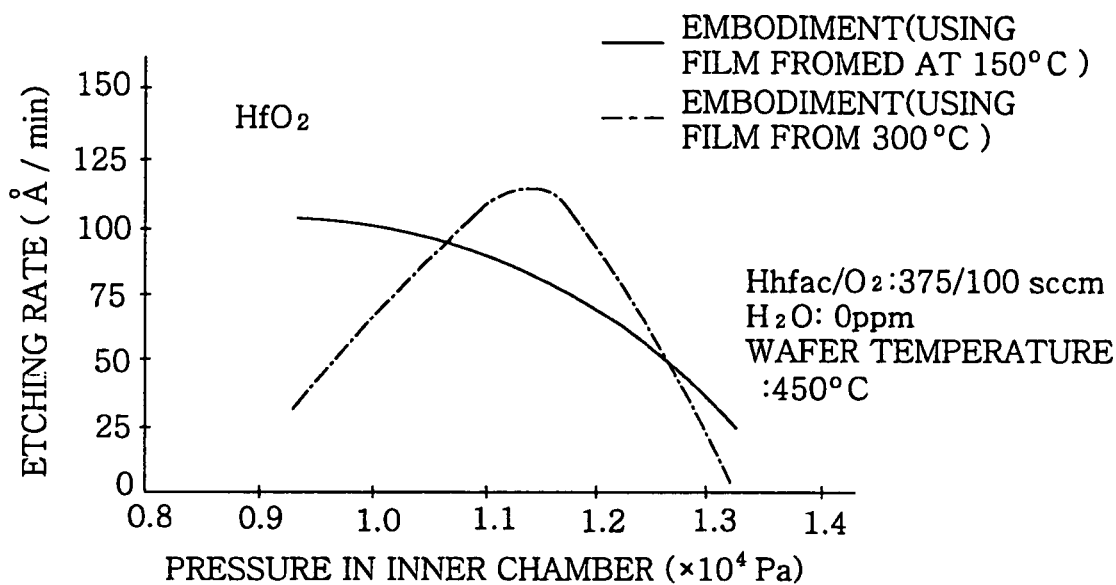
FIG. 9 offers a graph illustrating a relation between a pressure in an inner chamber and an etching rate of an $HfO_2$ film in accordance with an embodiment 3.

There will be described on the measurement results. FIG. 9 is a graph which illustrates a relation between a pressure in the wafer and an etching rate of an $HfO_2$ film in accordance with the present embodiment. As shown in the graph of FIG. 9, a high etching rate is achieved when the pressure in the inner chamber is between $0.95 \times 10^4$ and $1.20 \times 10^4$ Pa for the etching of the $HfO_2$ film formed at about 150° C. in accordance with the present embodiment. Meanwhile, a high etching rate is achieved when the pressure in the inner chamber is between $1.06 \times 10^4$ and $1.20 \times 10^4$ Pa for the etching of the $HfO_2$ film formed at about 300° C. in accordance with the present embodiment.

Resultantly, when cleaning the substrate-processing apparatus to which the $HfO_2$ film is adhered, it is thought that the pressure in the inner chamber is preferably maintained at between $1.06 \times 10^4$ and $1.20 \times 10^4$ Pa.

Embodiment 4

Hereinafter, an embodiment 4 will be described. In the present embodiment, when cleaning the substrate-processing apparatus to which $HfO_2$ adhered, there investigated about an optimum flow rate of the Hhfac. Further, during film-forming of $HfO_2$, the inner chamber had been heated to about 150° C. and the susceptor had been heated to about 300° C.

There will be explained on measurement conditions. In the present embodiment, as a substrate-processing apparatus, there was used the substrate-processing apparatus explained in the first embodiment. Herein, the substrate-processing apparatus to which $HfO_2$ adhered was not cleaned by the cleaning gas however $HfO_2$ film on the wafer was etched by the cleaning gas. A cleaning gas including Hhfac, $O_2$, $N_2$ and $H_2O$ was used. Hhfac, $O_2$, $N_2$ were supplied thereto at a ratio of 15:2:8 and a concentration of $H_2O$ in the cleaning gas was 1000 ppm. Furthermore, the pressure in the inner chamber was about $6.65 \times 10^3$ Pa and the temperature of the wafer was about 400° C. Such a state was maintained while the $HfO_2$ film was etched by changing the flow rate of Hhfac.

Figure 10:
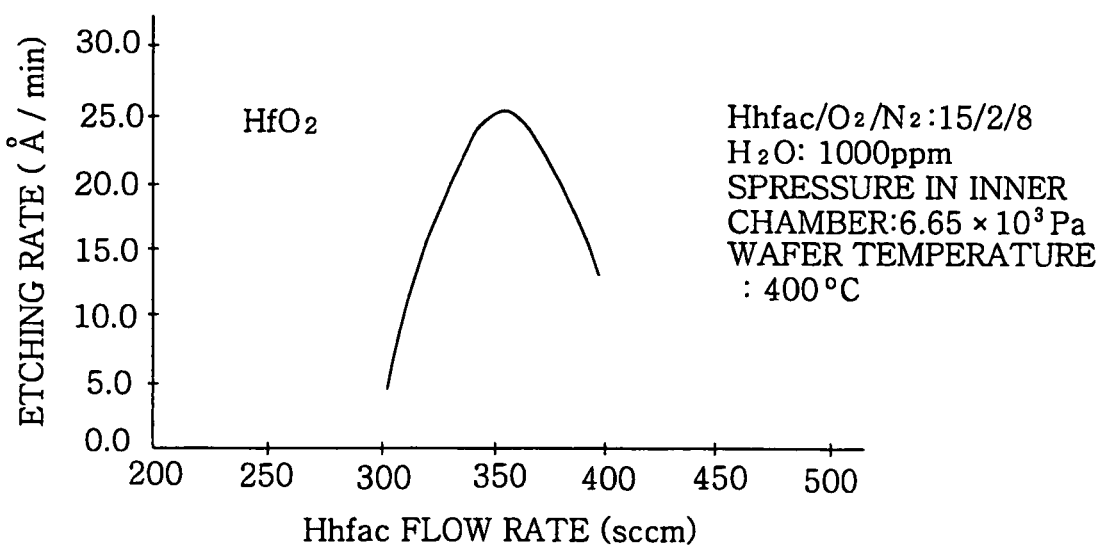
FIG. 10 shows a graph illustrating a relation between a flow rate of Hhfac and an etching rate in accordance with an embodiment 4.

There will be described on the measurement results. FIG. 10 is a graph which illustrates a relation between a concentration of Hhfac and an etching rate thereof in accordance with the present embodiment. As shown in the graph of FIG. 10, a high etching rate is achieved when the flow rate of the Hhfac is between 320 and 380 sccm.

Resultantly, when cleaning the substrate-processing apparatus to which the $HfO_2$ film is adhered, it is thought to be preferable that the Hhfac flows at a flow rate ranging from 320 to 380 sccm.

Embodiment 5

Hereinafter, an embodiment 5 will be described. In the embodiment 5, when cleaning the substrate-processing apparatus to which $Al_2O_3$ adhered, there investigated about an optimum flow rate of $O_2$. Further, during film-forming of $Al_2O_3$, the inner chamber had been heated to about 150° C. and the susceptor had been heated to about 300° C.

There will be explained on measurement conditions. In the present embodiment, as a substrate-processing apparatus, there was used the substrate-processing apparatus explained in the first embodiment. Herein, the substrate-processing apparatus to which $Al_2O_3$ adhered was not cleaned by the cleaning gas however $Al_2O_3$ film on the wafer was etched by the cleaning gas. As the $Al_2O_3$ film, the film formed by heating the wafer to about 150° C. and the film formed by heating the wafer to about 300° C. were used. A cleaning gas composed of Hhfac, $O_2$ and $H_2O$ was used. The flow rate of Hhfac was 375 scam and the concentration of $H_2O$ was 700 ppm. Further, the pressure in the inner chamber was about $9.31 \times 10^3$ Pa and the temperature of the wafer was about 450° C. Such a state was maintained while the $Al_2O_3$ film was etched by changing the flow rate of $O_2$.

Figure 11:
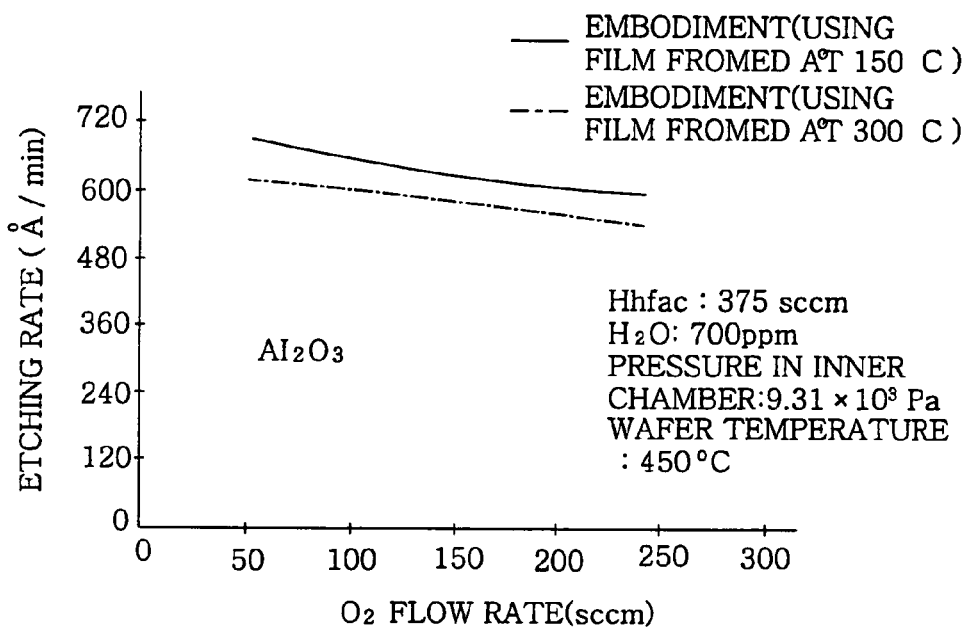
FIG. 11 depicts a graph illustrating a relation between a flow rate of $O_2$ and an etching rate of an $Al_2O_3$ film in accordance with an embodiment 5.

There will be described on the measurement results. FIG. 11 is a graph which illustrates a relation between a flow rate of $O_2$ and an etching rate of an $Al_2O_3$ film in accordance with the present embodiment. As shown in the graph of FIG. 11, a high etching rate is achieved when the flow rate of $O_2$ is between 50 sccm and 250 sccm for the etching of the $Al_2O_3$ film formed at about 150° C. in accordance with the present embodiment. Meanwhile, a high etching rate may be achieved when the flow rate of $O_2$ is between 50 sccm and 250 sccm for the etching of the $Al_2O_3$ film formed at about 300° C. in accordance with the present embodiment.

Resultantly, when cleaning the substrate-processing apparatus to which the $Al_2O_3$ film is adhered, it is thought to be preferable that $O_2$ flows at a flow rate ranging from 50 to 250 sccm.

Embodiment 6

Hereinafter, an embodiment 6 will be described. In the embodiment 6, when cleaning the substrate-processing apparatus to which $HfO_2$ adhered, there investigated about an optimum flow rate of $O_2$. Further, during film-forming of $HfO_2$, the inner chamber had been heated to about 150° C. and the susceptor had been heated to about 300° C.

There will be explained on the measurement conditions. In the present embodiment, as a substrate-processing apparatus, there was used the substrate-processing apparatus explained in the first embodiment. Herein, the substrate-processing apparatus to which $HfO_2$ adhered was not cleaned by the cleaning gas but $HfO_2$ film on the wafer was etched by the cleaning gas. For the $HfO_2$ film, the film formed by heating the wafer to about 150° C. and the film formed by heating the wafer to about 300° C. were used. A cleaning gas composed of Hhfac, $O_2$ and $H_2O$ was used. The flow rate of Hhfac was 375 sccm and the concentration of $H_2O$ was 700 ppm. Further, the pressure in the inner chamber was about $9.31 \times 10^3$ Pa and the temperature of the wafer was about 450° C. Such a state was maintained while the $HfO_2$ film was etched by changing the flow rate of $O_2$.

Figure 12:
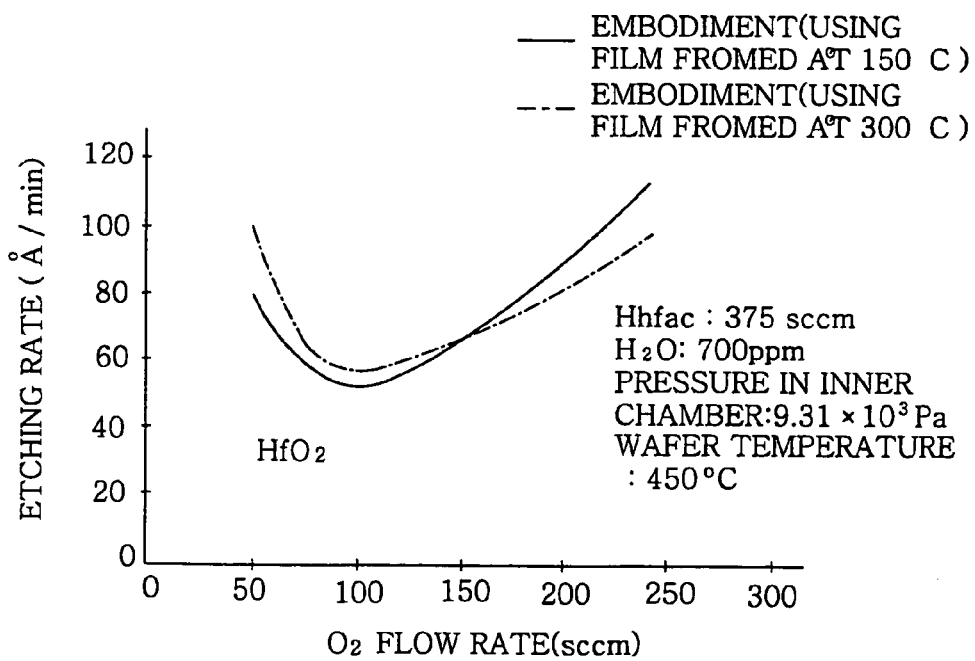
FIG. 12 presents a graph illustrating a relation between a flow rate of $O_2$ and an etching rate of an $HfO_2$ film in accordance with an embodiment 6.

There will be described on the measurement results. FIG. 12 is a graph which illustrates a relation between a flow rate of $O_2$ and an etching rate of an $HfO_2$ film in relation with the present embodiment. As shown in the graph of FIG. 12, a high etching rate is achieved when the flow rate of $O_2$ is between 50 sccm and 250 sccm, for the etching of the $HfO_2$ film formed at about 150° C. Meanwhile, a high etching rate is achieved when the flow rate of $O_2$ is between 50 sccm and 250 sccm for the etching of the $HfO_2$ film formed at about 300° C.

Resultantly, when cleaning the substrate-processing apparatus to which the $HfO_2$ film is adhered, it is thought to be preferable that $O_2$ flows at a flow rate ranging from 50 to 250 sccm.

Embodiment 7

Hereinafter, an embodiment 7 will be described. In the embodiment 7, when cleaning the substrate-processing apparatus to which $Al_2O_3$ adhered, there investigated about an optimum concentration of $H_2O$. Further, during film-forming of $Al_2O_3$, the inner chamber had been heated to about 150° C. and the susceptor had been heated to about 300° C.

There will be explained on measurement conditions. In the present embodiment, as a substrate-processing apparatus, there was used the substrate-processing apparatus explained in the first embodiment. Herein, the substrate-processing apparatus to which $Al_2O_3$ adhered was not cleaned by the cleaning gas however $Al_2O_3$ film on the wafer was etched by the cleaning gas. For the $Al_2O_3$ film, the film formed by heating the wafer to about 150° C. and the film formed by heating the wafer to about 300° C. were used. A cleaning gas composed of Hhfac, $O_2$ and $H_2O$ was used. Flow rates of Hhfac and $O_2$ were 375 sccm and 50 sccm, respectively. Further, the pressure in the inner chamber was about $9.31 \times 10^3$ Pa and the temperature of the wafer was about 450° C. Such a state was maintained while the $Al_2O_3$ film was etched by changing the concentration of $H_2O$.

Figure 13:
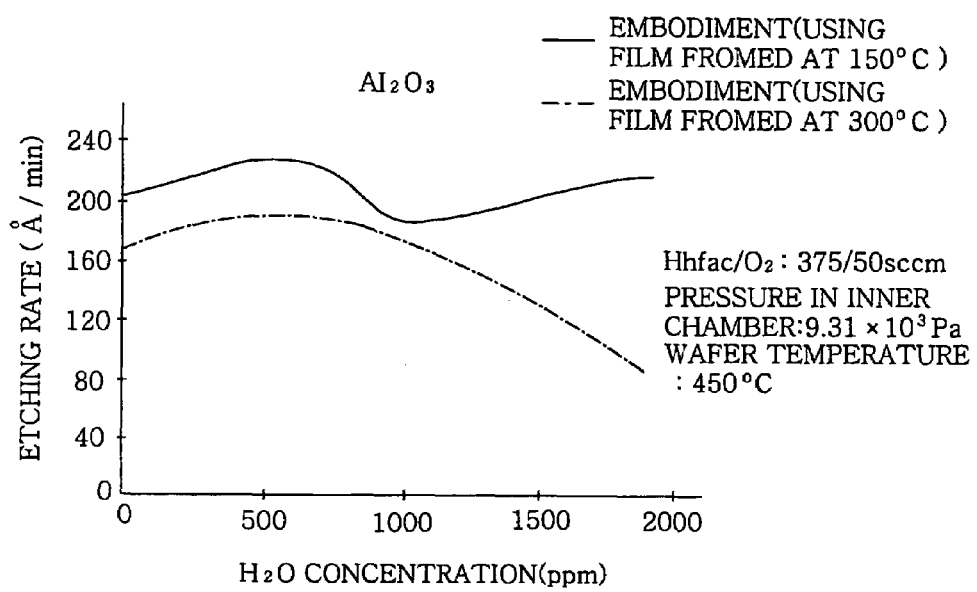
FIG. 13 depicts a graph illustrating a relation between a concentration of $H_2O$ and an etching rate of an $Al_2O_3$ film in accordance with an embodiment 7.

There will be described on the measurement results. FIG. 13 is a graph which illustrates a relation between a concentration of $H_2O$ and an etching rate of an $Al_2O_3$ film in accordance with the present embodiment. As shown in the graph of FIG. 13, a high etching rate is achieved when the concentration of $H_2O$ is less than or equal to 1000 ppm for the etching of the $Al_2O_3$ film formed at about 150° C. Meanwhile, a high etching rate is achieved when the concentration of $H_2O$ is less than or equal to 1000 ppm for the etching of the $Al_2O_3$ film formed at about 300° C. For both cases, high etching rate is achieved even when the concentration of $H_2O$ is 0 ppm.

Resultantly, when cleaning the substrate-processing apparatus to which the $Al_2O_3$ film is adhered, it is thought to be preferable that $H_2O$ is supplied less than or equal to 1000 ppm (including equal to 0 ppm).

Embodiment 8

Hereinafter, an embodiment 8 will be described. In the embodiment 8, when cleaning the substrate-processing apparatus to which $HfO_2$ adhered, there investigated about an optimum concentration of $H_2O$. Further, during film-forming of $HfO_2$, the inner chamber had been heated to about 150° C. and the susceptor had been heated to about 300° C.

There will be explained on measurement conditions. In the present embodiment, as a substrate-processing apparatus, there was used the substrate-processing apparatus explained in the first embodiment previously. Herein, the substrate-processing apparatus to which $HfO_2$ adhered was not cleaned by the cleaning gas however $HfO_2$ film on the wafer was etched by the cleaning gas. For the $HfO_2$ film, the film formed by heating the wafer to about 150° C. and the film formed by heating the wafer to about 300° C. were used. A cleaning gas including Hhfac, $O_2$ and $H_2O$ was used. Flow rates of Hhfac and $O_2$ were 375 sccm and 50 sccm, respectively. Further, the pressure in the inner chamber was about $9.31 \times 10^3$ Pa and the temperature of the wafer was about 450° C. Such a state was maintained while the $HfO_2$ film was etched by changing the concentration of $H_2O$.

Figure 14:
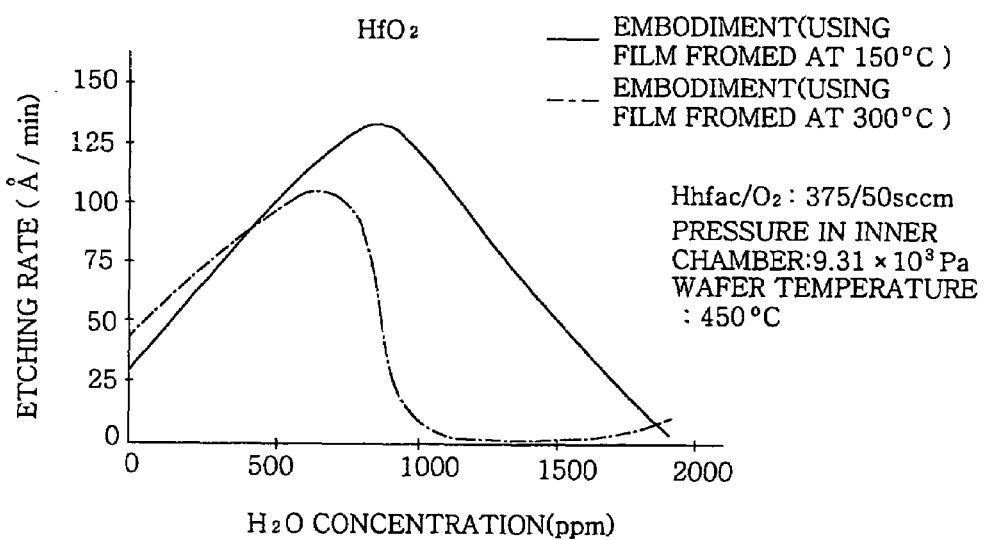
FIG. 14 shows a graph illustrating a relation between a concentration of $H_2O$ and an etching rate of an $HfO_2$ film in accordance with an embodiment 8.

There will be described on the measurement results. FIG. 14 is a graph which illustrates a relation between a concentration of $H_2O$ and an etching rate of an $HfO_2$ film in accordance with the present embodiment. As shown in the graph of FIG. 14, a high etching rate is achieved when the concentration of $H_2O$ is less than or equal to 1000 ppm for the etching of the $HfO_2$ film formed at about 150° C. Meanwhile, a high etching rate is achieved when the concentration of $H_2O$ is less than or equal to 1000 ppm for the etching of the $HfO_2$ film formed at about 300° C. in accordance with the present embodiment. For both cases, the high etching rate thereof may be achieved even when the concentration of $H_2O$ is 0 ppm.

Resultantly, when cleaning the substrate-processing apparatus to which the $HfO_2$ film is adhered, it is thought to be preferable that $H_2O$ is supplied thereto at a concentration of less than or equal to 1000 ppm (including equal to 0 ppm).

Embodiment 9

Hereinafter, an embodiment 9 will be described. In the embodiment 9, when cleaning the substrate-processing apparatus to which $HfO_2$ adhered, there investigated about an optimum concentration of $C_2H_5OH$. Further, during film-forming of $HfO_2$, the inner chamber had been heated to about 150° C. and the susceptor had been heated to about 300° C.

There will be explained on measurement conditions. In the present embodiment, as a substrate-processing apparatus, there was used the substrate-processing apparatus explained in the first embodiment previously. Herein, the substrate-processing apparatus to which $HfO_2$ adhered was not cleaned by the cleaning gas but $HfO_2$ film on the wafer was etched by the cleaning gas. A cleaning gas composed of Hhfac, $O_2$, $N_2$ and $C_2H_5OH$ was used. Flow rates of Hhfac, $O_2$ and $N_2$ were 375 sccm, 50 sccm and 200 sccm, respectively. Further, the pressure in the inner chamber was about $6.65 \times 10^3$ Pa and the temperature of the wafer was about 400° C. Such a state was maintained while the $HfO_2$ film was etched by changing the concentration of $C_2H_5OH$.

Figure 15:
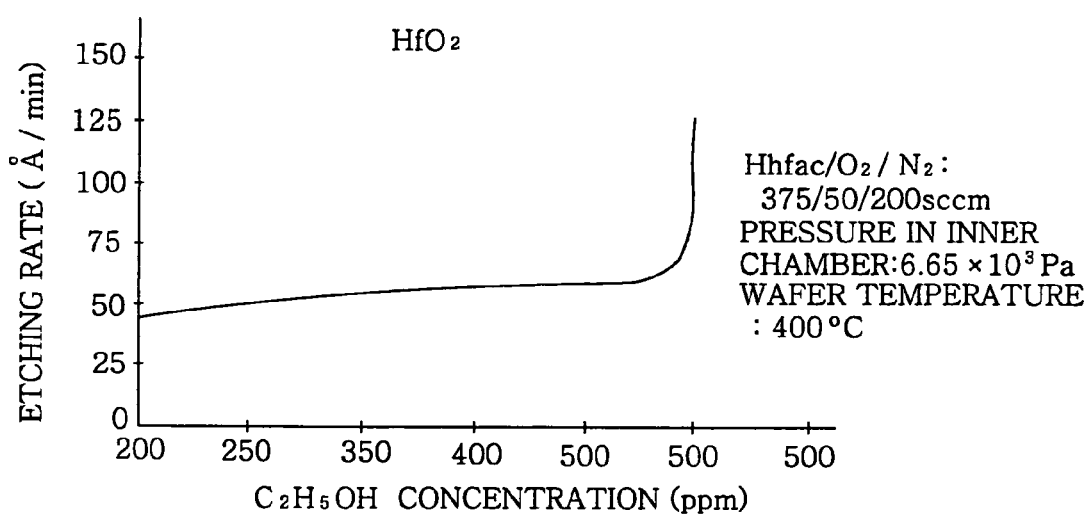
FIG. 15 offers a graph illustrating a relation between a concentration of $C_2H_5OH$ and an etching rate thereof in accordance with an embodiment 9.

There will be described on the measurement results. FIG. 15 is a graph which illustrates a relation between a concentration of $C_2H_5OH$ and an etching rate in accordance with the present embodiment. As shown in the graph of FIG. 15, a high etching rate is achieved when the concentration of $C_2H_5OH$ is between 500 ppm and 1000 ppm.

Resultantly, when cleaning the substrate-processing apparatus to which the $HfO_2$ film is adhered, it is thought to be preferable that $C_2H_5OH$ is supplied thereto at a concentration ranging from 500 ppm to 1000 ppm.

Second Embodiment

Hereinafter, the present invention is described in accordance with a second embodiment. Further, there will be omitted an explanation of what is previously described with reference to the first embodiment.

Figure 16:
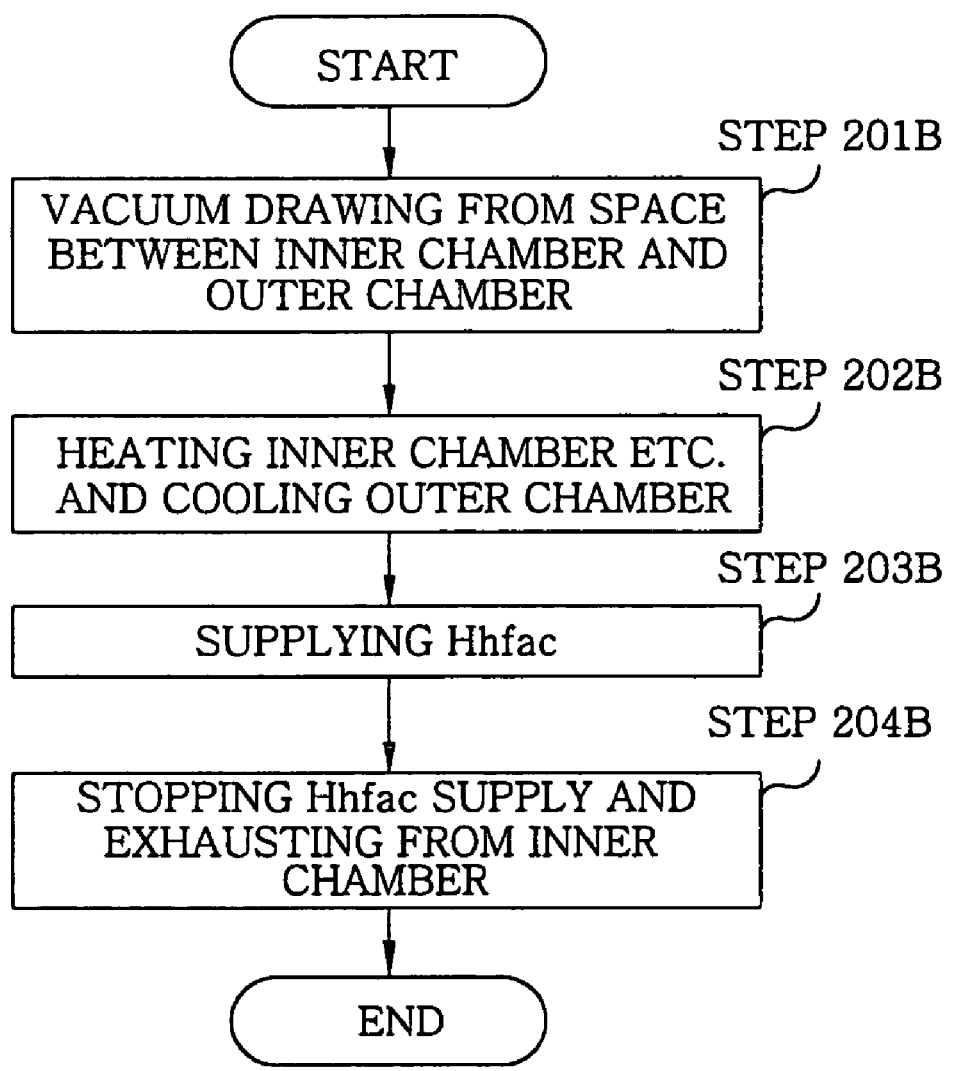
FIG. 16 shows a flow chart of cleaning which is performed by the substrate-processing apparatus in accordance with the second embodiment of the present invention.

In accordance with the embodiment of the present invention, there will be explained an example of exhausting the inside of the inner chamber after storing the Hhfac in the inner chamber and making a complex of $Al_2O_3$ which is adhered to the inside of the inner chamber. FIG. 16 is a flow chart showing a cleaning flow which is performed by the substrate-processing apparatus 10 in accordance with the embodiment of the present invention.

First, the wafer W is loaded from the inner chamber 201, a thin film of $Al_2O_3$ being formed thereon, and then a vacuum drawing is performed from the space between the inner chamber 201 and the outer chamber 202 by operating the depressurization pump (step 201B).

Next, an electrical current flows to the heater 210 and the chamber heaters 220A, 220B, and then the inner chamber 201 is heated to about 350° C. and the susceptor 209 is heated to about 400° C. Further, the cooling water flows into the cooling jacket 208, thereby cooling the outer chamber 202 (step 202B).

The inner chamber 201 is heated to about 350° C. and the susceptor 209 is heated to about 400° C., and then the Hhfac is supplied into the inner chamber 201 at a flow rate ranging from 320 sccm to 380 sccm by opening the valves 17D, 19D and the switching valve 16D (step 203B).

The Hhfac is diffused into the inner chamber 201 and contacts with $Al_2O_3$ which is adhered to the inner chamber 201 to form a complex of Al. Herein, in the present embodiment, the conductance valve 15B is kept being shut and the cleaning gas which is supplied into the inner chamber 201 is not exhausted but stored in the inner chamber 201.

After forming the complex sufficiently, supplying of a carrier gas and Hhfac is stopped by closing the switching valve 16D, the valves 19D, 17D and simultaneously the inside of the inner chamber 201 is exhausted by opening a conductance valve 15B (step 204B). By the exhausting thereof, the complex of Al is gasified and separated from the inner wall of inner chamber 201 and the susceptor 209, and simultaneously discharged out of the inner chamber 201 via the exhausting pipe 204B. Next, the cleaning is completed after the complex of Al is discharged out of the inner chamber 201 sufficiently.

In the present embodiment, by exhausting the inside of the inner chamber 201 after storing Hhfac in the inner chamber 201, particular effectiveness can be achieved that the Hhfac may reach every hole and corner in the inner chamber 201 and $Al_2O_3$ which is adhered to the inner chamber 201 can be removed more securely. Further, by exhausting thereof after storing Hhfac in the inner chamber 201, Hhfac can be saved, thereby capable of reducing a cost.

Third Embodiment

Figure 17:
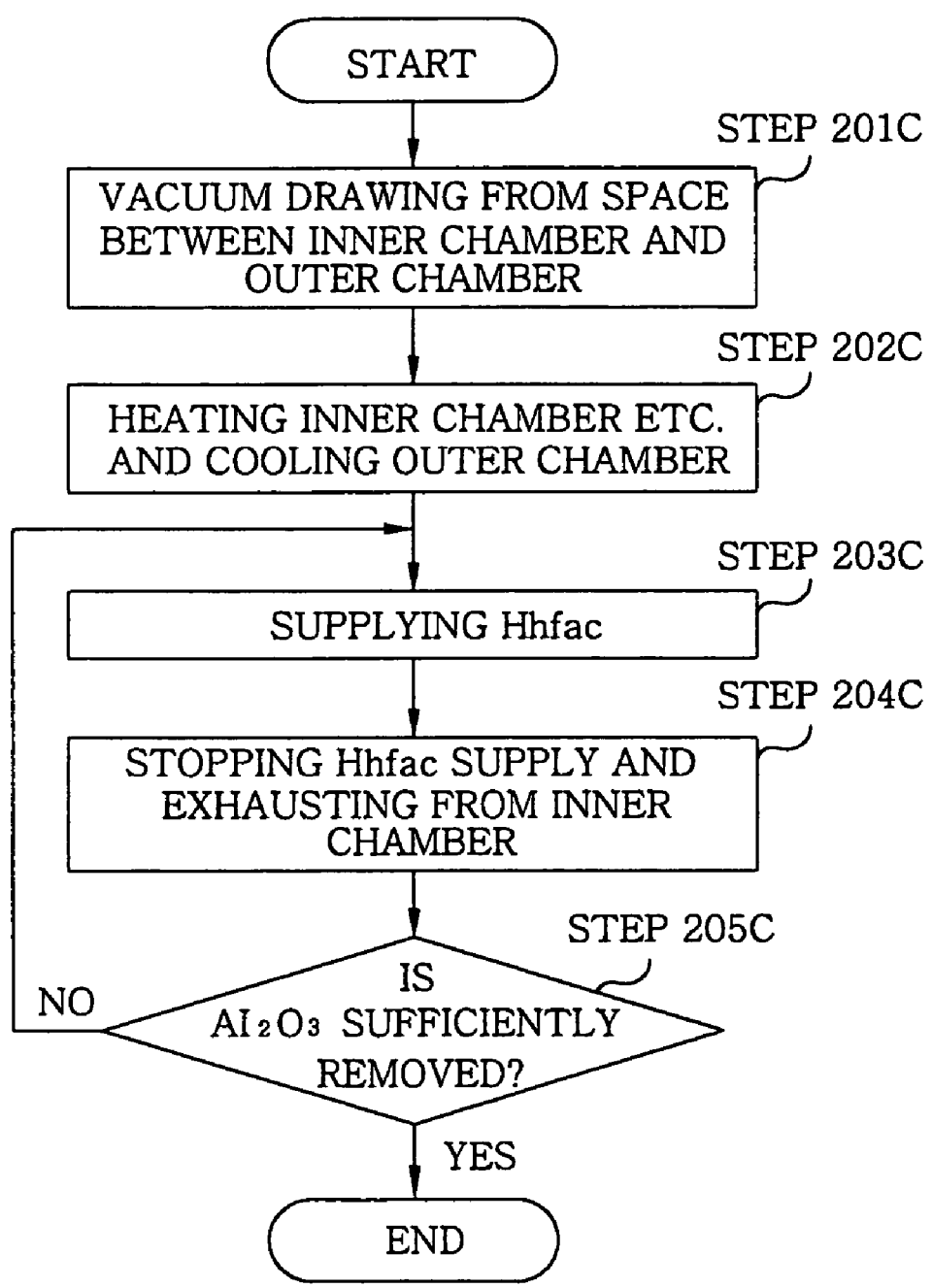
FIG. 17 presents a flow chart of cleaning which is performed by the substrate-processing apparatus in accordance with the third embodiment of the present invention.

Hereinafter, the present invention is described in accordance with a third embodiment. In the present embodiment, there will be described an example of intermittently repeating a series of process that the inside of the inner chamber is exhausted after making a complex of $Al_2O_3$ which is adhered into the inner chamber 201 by storing Hhfac in the inner chamber 201. FIG. 17 is a flow chart showing a cleaning flow which is performed by the substrate-processing apparatus 10 in accordance with the present embodiment.

As shown in FIG. 17, after loading the wafer W, a thin film of $Al_2O_3$ is formed thereon, from the inside of the inner chamber 201, a vacuum drawing is performed to the space between the inner chamber 201 and the outer chamber 202 by operating the depressurization pump 217 (step 201C).

Next, an electrical current flows into the heater 210 and the chamber heaters 220A, 220B and then the inner chamber 201 is heated to about 350° C. and the susceptor 209 is heated to about 400° C. Further, the cooling water flows into the cooling jacket, thereby cooling the outer chamber 202 (step 202C).

After the inner chamber 201 is heated to about 350° C. and the susceptor 209 is heated to about 400° C., Hhfac is supplied into the inner chamber 201 at a flow ranging from 320 sccm to 380 sccm by opening the valves 17D, 19D and the switching valve 16D (step 203C).

After forming the Al complex sufficiently, supplying of a carrier gas and Hhfac is stopped by closing the switching valve 16D, the valves 19D, 17D and, at the same time, the inside of the inner chamber 201 is exhausted by opening a conductance valve 15B (step 204C).

After discharging the Al complex out of the inner chamber 201 sufficiently the amount of $Al_2O_3$ which is adhered to the inner chamber 201 is checked (step 205C). The checking procedure thereof can be performed by validating adhering status of an $Al_2O_3$ to the inner wall of the inner chamber 201 or a remaining amount of $Al_2O_3$ which is formed on a monitoring-purpose wafer. Further, by using an observation window (not shown) which is installed in the inner chamber 201, it is possible to check by an infrared spectroscopy. From a result of checking the remaining amount of $Al_2O_3$ which is adhered to the inner chamber 201, if $Al_2O_3$ which is adhered to the inner chamber 201 is sufficiently removed, the cleaning is completed.

Contrarily, from a result of checking the remaining amount of $Al_2O_3$ which is adhered to the inner chamber 201, if $Al_2O_3$ which is adhered to the inner chamber 201 is not sufficiently removed, the operations of step 203C and the step 204C are repeated, and finally the cleaning operation is continued until $Al_2O_3$ which is adhered to the inner chamber 201 is completely removed.

In the present embodiment, by performing repeatedly a series of processes of storing Hhfac in the inner chamber 201 and exhausting the inside of the inner chamber 201 after storing Hhfac in the inner chamber 201, there can be achieved particular effectiveness that $Al_2O_3$ which is adhered to the inner chamber 201 can be removed efficiently and a forming of the complex and a discharging thereof can be performed completely.

Fourth Embodiment

Figure 18:
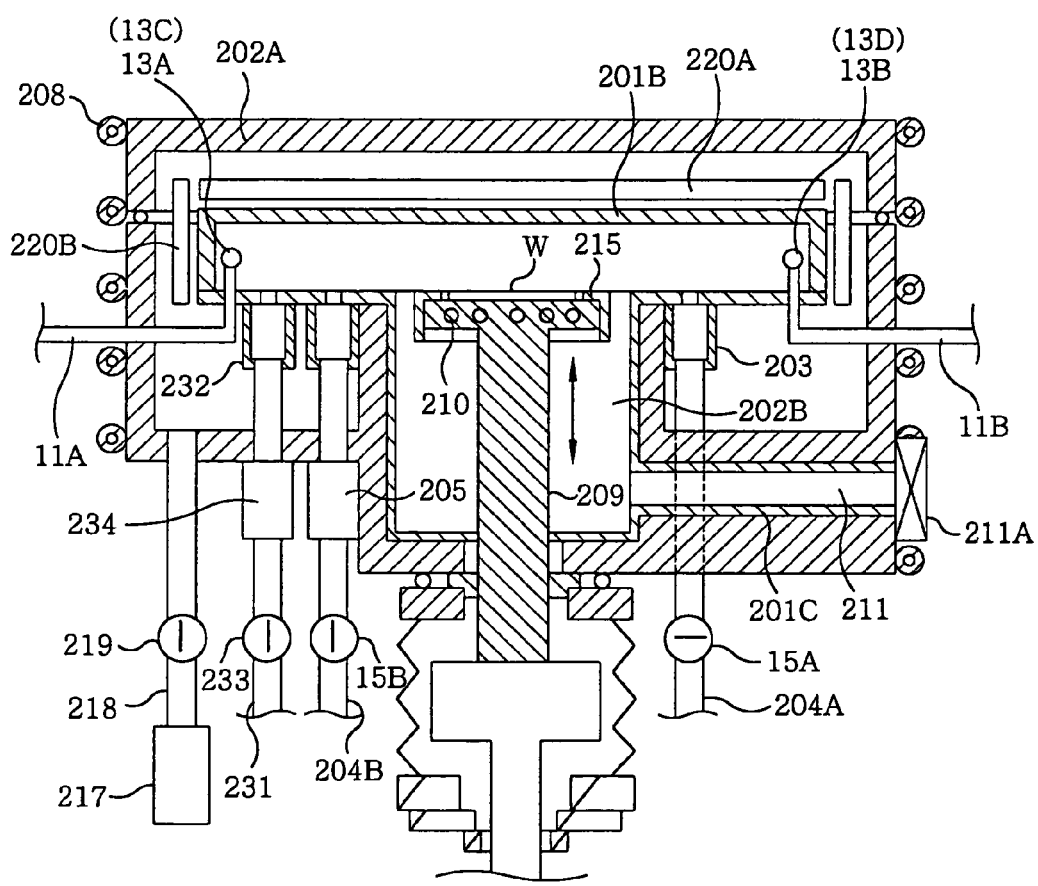
FIG. 18 depicts an inside of the processing vessel schematically in accordance with the fourth embodiment of the present invention.

Hereinafter, there will be described a fourth embodiment in accordance with the present invention. In the present embodiment, an example of installing an exhausting pipe which is used only when cleaning thereof is explained. FIG. 18 shows an inside of the processing vessel schematically in accordance with the embodiment of the present invention.

As shown in FIG. 18, an exhausting pipe 231 is connected to the inner chamber 201 via a liner 232, an exhausting pipe 231 being used only for cleaning thereof, in addition to the exhausting pipe 204A, 204B. The exhausting pipe 231 is provided with a conductance valve 233 and a trap 234. Further, the exhausting pipes 204A, 204B are used only when forming a film, and are not used when cleaning thereof.

In the present embodiment, by installing the exhausting pipe 231 which is used only for cleaning thereof, the Al complex, etc. can be prevented from being adhered to the inside of the exhausting pipes 204A, 204B.

Further, the exhausting pipe 231 is equipped with the trap 234, the Al complex included in the exhaust during cleaning thereof is removed from the trap 234. Consequently, the complex can be prevented from being adhered to the inside of the exhaust pipe 231 which is located at the lower side from the trap 234.

Fifth Embodiment

Figure 19:
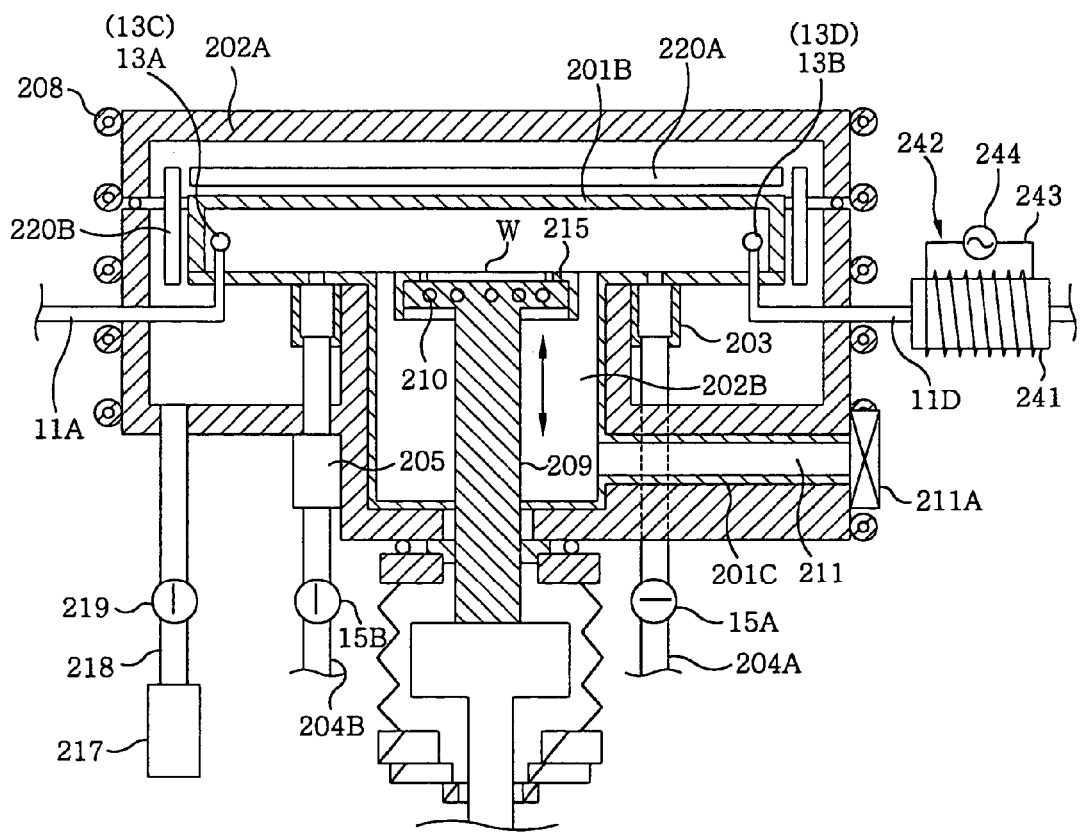
FIG. 19 describes an inside of the processing vessel schematically in accordance with the fifth embodiment of the present invention.

Hereinafter, there will be described a fifth embodiment in accordance with the present invention. In the present embodiment, an example of performing a cleaning by using $NF_3$ is explained. FIG. 19 shows an inside of the processing vessel in accordance with the embodiment of the present invention, schematically.

As shown in FIG. 19, a remote chamber 241 is provided with a fourth source supply line 11D. Further, $NF_3$ instead of Hhfac is stored in a source tank 20D. At a peripheral of the remote chamber 241, there is installed a radical generating unit 242 which renders $NF_3$ which is supplied into the remote chamber 241 to be excited to generate an F radical from $NF_3$. The radical generating unit 242 mainly includes a copper line 243 which coils the remote chamber 241 and a high frequency power supply 244 which is connected to the copper line 243. By an operation of the high frequency power supply 244, a high frequency current of 13.56 MHz flows in the copper line 243, so that $NF_3$ which is supplied into the remote chamber 241 is excited, thereby an F radical being generated. Further, an F ion etc. is generated in addition to the F radical.

In the source tank 20B, $O_2$ is stored, instead of $H_2O$. In the present embodiment, a film of $Al_2O_3$ is not formed on the wafer W, but a film of $HfO_2$ is formed on the wafer W by using $Hf(t-OC_4H_9)_4$ and $O_2$ on the wafer W. Further, when forming a film of $HfO_2$ thereon, the valves 17C, 19C and the switching valve 16C are opened and closed instead of the valves 17A, 19A and the switching valve 16A.

Figure 20:
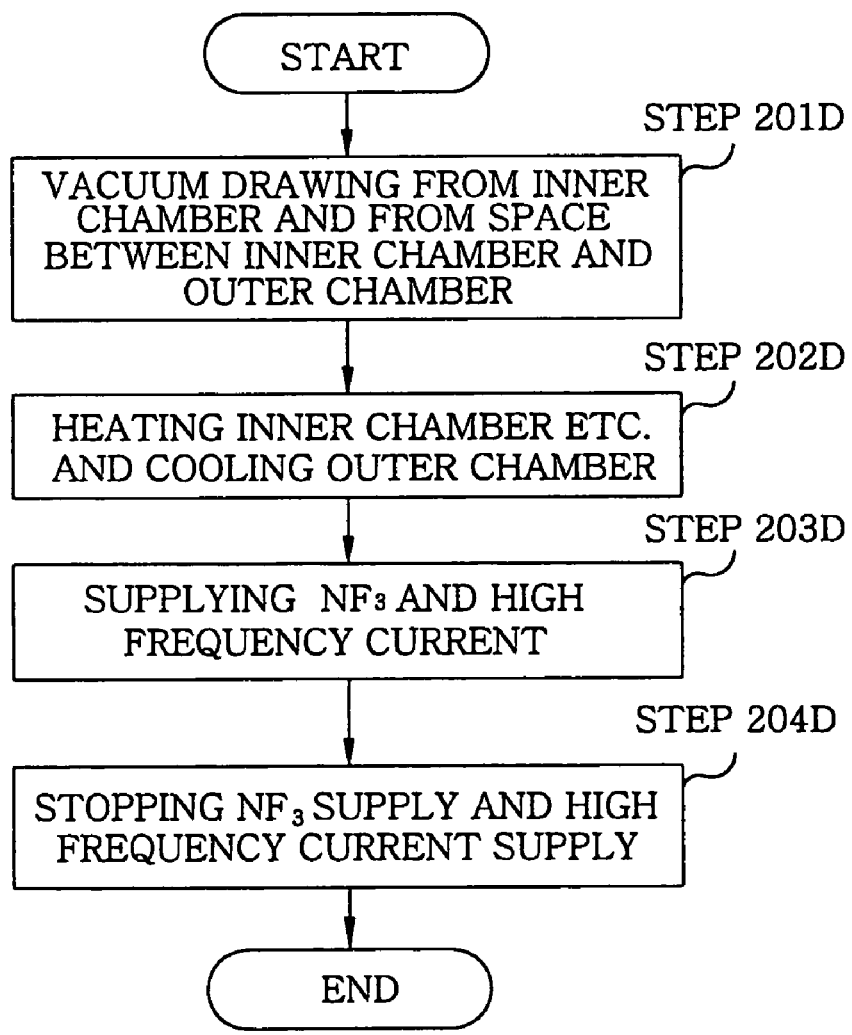
FIG. 20 offers a flow chart of cleaning which is performed by the substrate-processing apparatus in accordance with the fifth embodiment of the present invention.

Hereinafter, in FIG. 20, there will be explained a flow of cleaning which is performed by the substrate-processing apparatus 10. FIG. 20 is a flow chart showing a flow of the cleaning which is performed by the substrate-processing apparatus 10 in accordance with the embodiment of the present invention.

First, by operating the depressurization pump which is not shown, a vacuum drawing is performed from the inside of the inner chamber 201 via the exhausting pipe 204. Further, by operating the depressurization pump 217, a vacuum drawing is performed from the space between the inner chamber 201 and the outer chamber 202 (step 201D).

Next, an electrical current flows into the heater 210 and the chamber heaters 220A, 220B, and the inner chamber 201 and the susceptor 209 etc. are heated up to the temperature ranging from about 300° C. to about 500° C. Further, the cooling water flows into the cooling jacket, thereby cooling the outer chamber 202 (step 202D).

After the pressure of the inner chamber 201 is maintained at less than or equal to 650 Pa and the temperatures of the inner chamber 201 and the susceptor 209 are stabilized within the range from about 300 C to about 500 C, $NF_3$ is supplied into the inner chamber 201 at the flow rate of about 500 sccm by opening the valves 17D, 19D and the switching valve 16D. Further, by operating the high frequency power supply, a high frequency current of 13.56 MHz flows into the copper line 243 (step 203D). By flowing the high frequency current into the copper line 243, $NF_3$ which is supplied into the inner chamber 201 is excited, thereby generating an F radical. The generated F radical is supplied into the inner chamber 201 by, e.g., an exhaust of the inner chamber 201. If the F radical is supplied into the inner chamber 201, there occurs a chemical reaction between the F radical and $HfO_2$ which is adhered to the inner wall of the inner chamber 201, thereby generating $HfF_4$. The generated $HfF_4$ is gasified and discharged from the inner chamber 201 by an exhausting thereof.

After a predetermined time has passed, the supply of the high frequency current is stopped at the same time as the closing of the valves 17D, 19D and the switching valve 16D to complete the cleaning of the inner chamber 201 (step 204D).

In the present example, the F radical is supplied into the inner chamber 201, so that $HfO_2$ adhered to the inner wall of the inner chamber 201 and the susceptor 209 can be removed.

Embodiment 10

Hereinafter, an embodiment 10 will be described. In the present embodiment, when cleaning the substrate-processing apparatus to which $HfO_2$ adhered, there investigated about an optimum temperature of the inner chamber.

There will be explained on measurement conditions. In the present embodiment, as a substrate-processing apparatus, there was used the substrate-processing apparatus explained in the fifth embodiment previously. Herein, the substrate-processing apparatus to which $HfO_2$ adhered was not cleaned by the cleaning gas but $HfO_2$ film on the wafer was etched by the cleaning gas. A cleaning gas composed of $NF_3$ and Ar was used. Flow rates of $NF_3$ and Ar were 500 sccm and 500 sccm, respectively. Further, the pressure in the inner chamber was about $2.00 \times 10^2$ Pa. Such a state was maintained while the $HfO_2$ film was etched by changing the temperature thereof.

Figure 21:
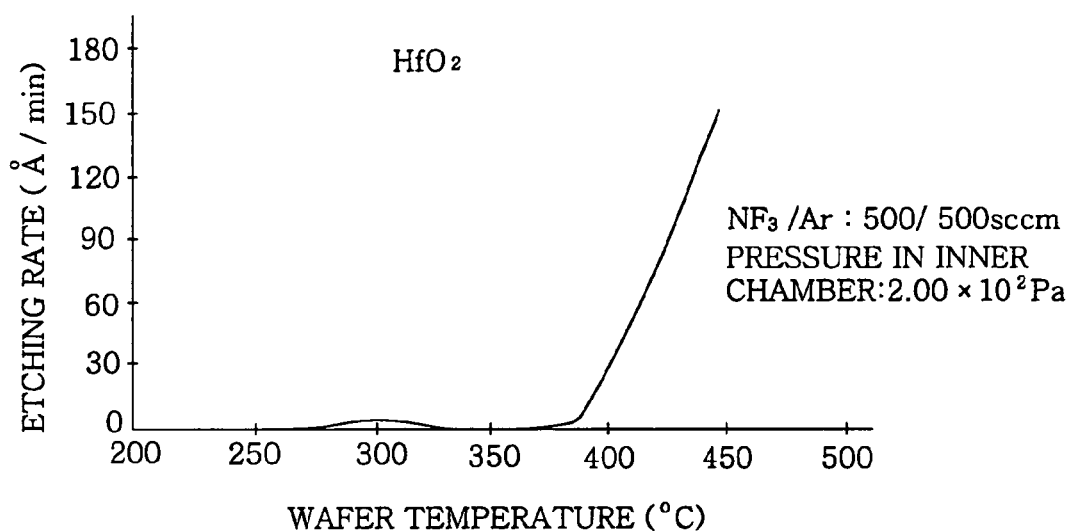
FIG. 21 offers a graph illustrating a relation between a wafer temperature and an etching rate of $HfO_2$ film in accordance with an embodiment 10.

There will be described on the measurement results. FIG. 21 is a graph which illustrates a relation between a temperature of the wafer and an etching rate of the $HfO_2$ film in accordance with the present embodiment. As shown in the graph of FIG. 21, a high etching rate may be achieved when the temperature of the wafer is more than or equal to 400° C., more preferably more than or equal to 400° C. and less than or equal to 450° C.

Resultantly, when cleaning the substrate-processing apparatus to which the $HfO_2$ film is adhered by using the F radical, it is thought that the inner chamber is heated to more than or equal to 400° C., and more preferably more than or equal to 400° C. and less than or equal to 450° C.

Embodiment 11

Hereinafter, an embodiment 11 will be described. In the present embodiment, when cleaning the substrate-processing apparatus, $HfO_2$ adhered thereto, by a Cl radical, there investigated about an optimum temperature of the inner chamber.

There will be explained on measurement conditions. In the present embodiment, as a substrate-processing apparatus, there was used the substrate-processing apparatus explained in the fifth embodiment previously. Herein, the substrate-processing apparatus to which $HfO_2$ adhered was not cleaned by the cleaning gas but $HfO_2$ film on the wafer was etched by the cleaning gas. A cleaning gas composed of HCl and Ar was used. Flow rates of HCl and Ar were 200 sccm, 1000 sccm, respectively. Further, the pressure in the inner chamber was about $1.33 \times 10^2$ Pa. Such a state was maintained while the $HfO_2$ film was etched by changing the temperature of the wafer.

Figure 22:
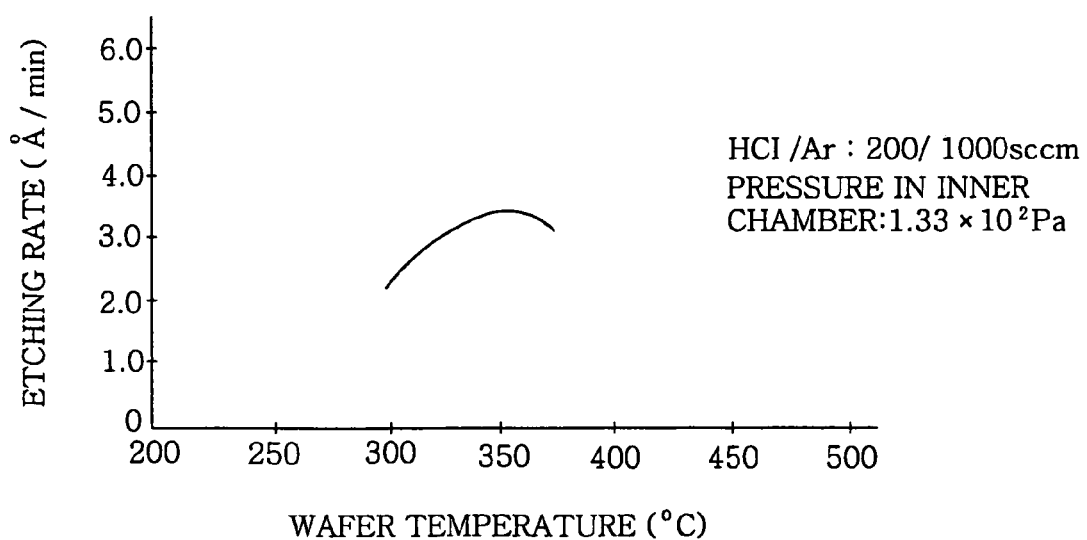
FIG. 22 shows a graph illustrating a relation between a wafer temperature and an etching rate of $HfO_2$ film in accordance with an embodiment 11.

There will be described on the measurement results. FIG. 22 is a graph which illustrates a relation between a temperature of the wafer and an etching rate of the $HfO_2$ film in accordance with the present embodiment. As shown in the graph of FIG. 22, a high etching rate is achieved when the temperature of the wafer is between about 300° C. and about 400° C.

Resultantly, when cleaning the substrate-processing apparatus to which the $HfO_2$ film is adhered by using the Cl radical, it is thought to be preferable that the inner chamber is heated to more than or equal to 300 C and less than or equal to 400° C.

Sixth Embodiment

Figure 23:
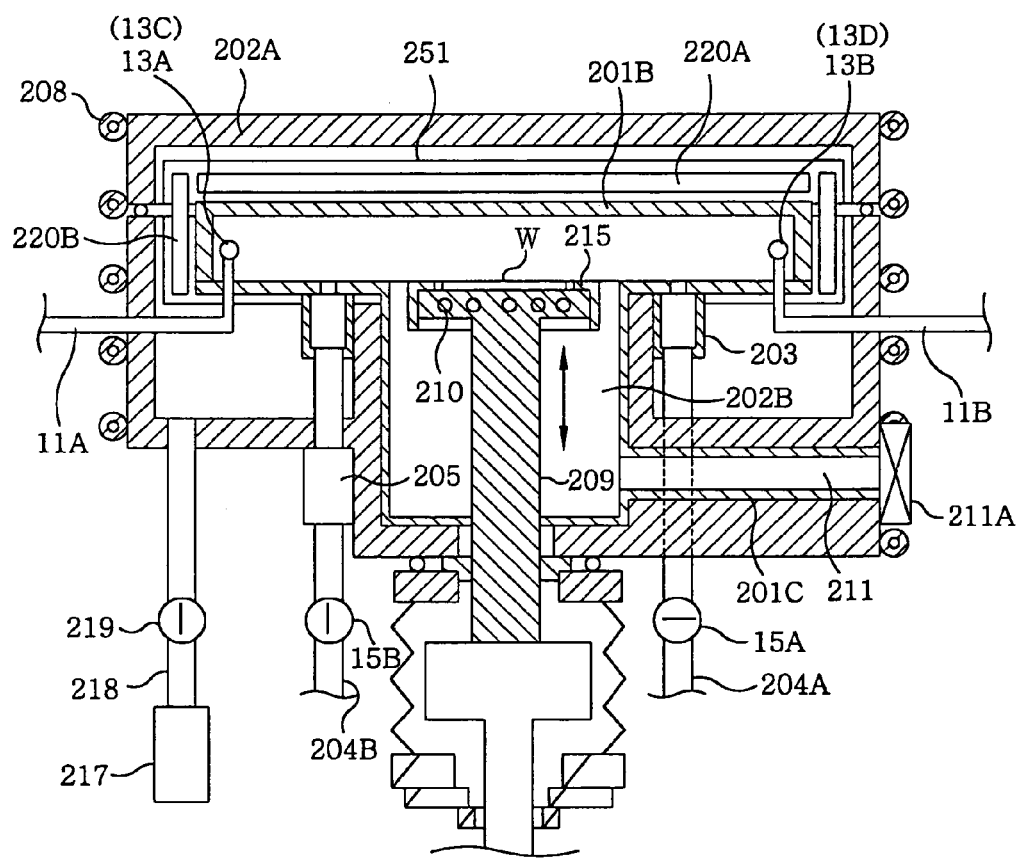
FIG. 23 depicts an inside of the processing vessel schematically in accordance with the sixth embodiment of the present invention.

Hereinafter, there will be described a sixth embodiment in accordance with the present invention. In the present embodiment, there will be explained an example of installing a reflection plate at an outer side of the chamber heater. FIG. 23 shows an inside of the processing vessel schematically in accordance with the embodiment of the present invention.

As shown in FIG. 23, in the space between the chamber heaters 220A, 220B and the outer chamber 202, the reflecting plate 251 which reflects a heat ray irradiated from the chamber heaters 220A, 220B is installed. Specifically, an end portion of the reflecting plate 251 is bent downward and is located between the chamber heater 220B at both side ends and the outer chamber 202, thereby reflecting the heat ray from the chamber heater 220B. The reflecting plate 251 is made of materials which have a reflecting property such as metal or ceramics.

In the present embodiment, the reflecting plate 251 is installed to a space between the chamber heaters 220A, 220B and the outer chamber 202, so that a heat can be provided to the inner chamber 201 efficiently, the heat being radiated from the chamber heater 220A, 220B. Consequently, the inner chamber 201 can be heated efficiently when cleaning thereof.

Seventh Embodiment

Figure 24:
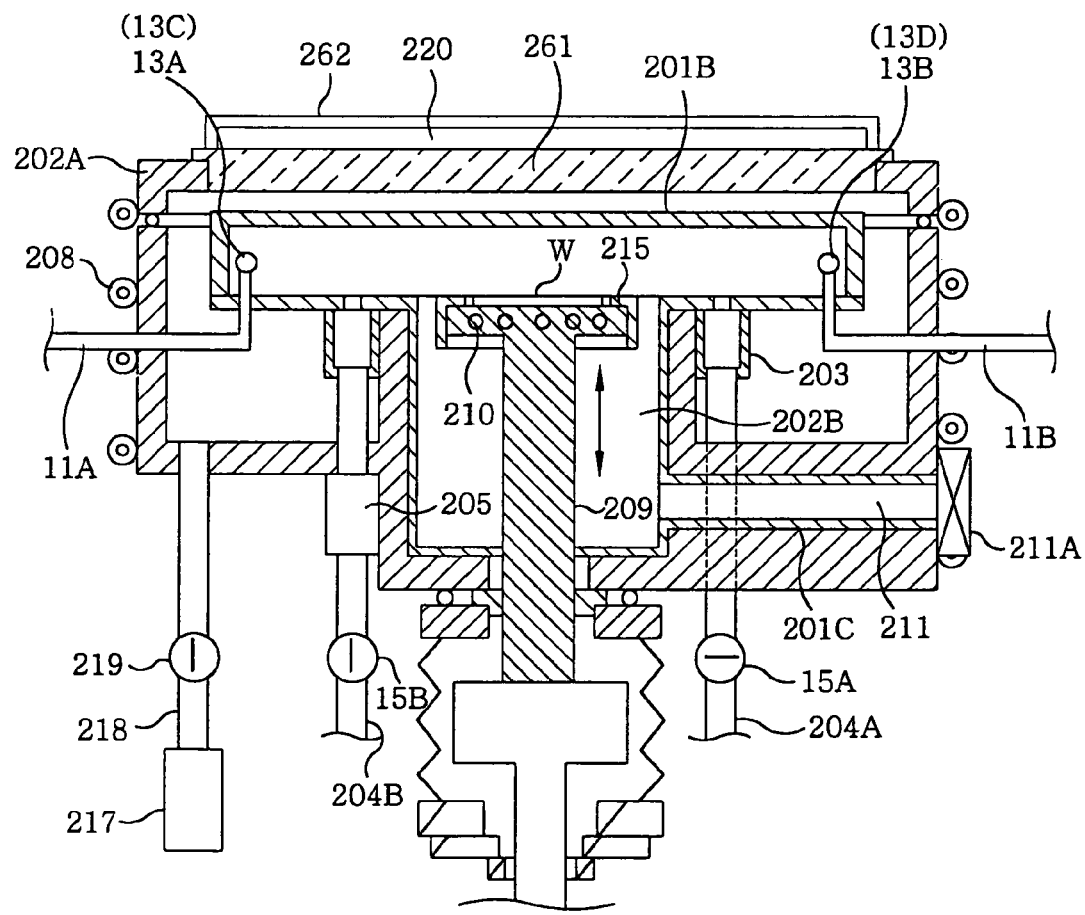
FIG. 24 describes an inside of the processing vessel schematically in accordance with the seventh embodiment of the present invention.

Hereinafter, there will be described a seventh embodiment in accordance with the present invention. In the present embodiment, there will be explained an example of installing a chamber heater at an outer side of the chamber. FIG. 24 shows an inside of the processing vessel schematically in accordance with the embodiment of the present invention.

As shown in FIG. 24, an opening is provided to a cover plate 202A of a top portion of the outer chamber 202. A penetrating window 261 made of quarts material which penetrates a heat ray is located at the opening. The chamber heater 220 is installed at the outer side of the penetrating window 261. When cleaning thereof, the chamber heater 220 is heated by flowing the electric current into the chamber heater 220. The heat ray which is radiated from the chamber heater 220 passes through the penetrating window 261. Accordingly, the inner chamber 201 is heated. Further, the reflecting plate 262 is installed at a side of back surface of the chamber heater 220.

In the present embodiment, as the chamber heater 220 is installed at the outer side of the outer chamber 202, a repairing and a checking of the chamber heater 220 can be facilitated. Further, for the same reason, the outer chamber 202 can be miniaturized. A structure of the outer chamber 202 can be simplified.

Additionally, the present invention is not limited by the first to the seventh embodiments described herein, therefore, a structure, a material, an arrangement of each part and the like can be changed and modified without departing from the spirit and scope of the invention. In the first to the seventh embodiments, a double chamber which includes the inner chamber 201 and the outer chamber 202 is employed. However, the chamber does not have to be double.

In the first to the seventh embodiments, as a cleaning gas, Hhfac and $NF_3$ are used. However, the cleaning gas needs not be limited thereto. For example, β-diketone other than Hhfac can be used. As the β-diketone other than Hhfac, for example, tetramethyle heptandion (Hthd) can be selected. Further, as the β-diketone, it is preferable to have a structural formula of $R^1(CO)CH_2(CO)R^2$ ($R^1$ and $R^2$ are independent of each other, either alkyl or halogen alkyl). Additionally, other than β-diketone, it is possible to use acetone or acetylaceton. Further, there can be used a gas which contains fluorine other than $NF_3$. As a gas containing fluorine, there can be selected, for example, $SF_6$, $CF_4$, $C_2F_6$, $CHF_3$, HF, $F_2$ or $CF_3COOH$. Furthermore, there can be used a gas containing chlorine, instead of fluorine. As a gas containing chlorine, there can be selected, for example, HCl, $Cl_2$ or $BCl_3$.

In the first to the seventh embodiments, as the processing gas, TMA and $H_2O$, or $Hf(t-OC_4H_9)_4O_2$ is used. However, the processing gas is not limited thereto. For example, combination of TMA and $O_3$, $TiCl_4$ and $NH_3$, $TiF_4$ and $NH_3$, $TiBr_4$ and $NH_3$, $TiI_4$ and $NH_3$, $Ti[N(C_2H_5CH_3)_2]_4$ (TEMAT) and $NH_3$, $Ti[N(CH_3)_2]_4$ (TDMAT) and $NH_3$, $Ti[N(C_2H_5)_2]_4$ (TDEAT) and $NH_3$, $Ta(OC_2H_5)_5$ and $O_2$, $Ta(OC_2H_5)_5$ and $H_2O$, $Ta(OC_2H_5)_5$ and $H_2O_2$, $Hf[N(CH_3)_2]_4$ and $O_3$, $Hf[N(C_2H_5)_2]_4$ and $O_3$, $Zr[N(CH_3)_2]_4$ and $O_3$, or $Zr[N(C_2H_5)_2]_4$ and $O_3$ may be used. Additionally, for the case of using $TiF_4$ and $NH_3$, $TiBr_4$ and $NH_3$, $TiI_4$ and $NH_3$, $Ti[N(C_2H_5CH_3)_2]_4$ (TEMAT) and $NH_3$, $Ti[N(CH_3)_2]_4$ (TDMAT) and $NH_3$ or $Ti[N(C_2H_5)_2]_4$ (TDEAT) and $NH_3$, a TiN film is formed on the wafer W. Moreover, for the case of using $Ta(OC_2H_5)_5$ and $O_2$, $Ta(OC_2H_5)_5$ and $H_2O$ or $Ta(OC_2H_5)_5$ and $H_2O_2$, a $Ta_2O_5$ film is formed on the wafer W. For the case of using $Hf[N(CH_3)_2]_4$ and $O_3$ or $Hf[N(C_2H_5)_2]_4$ and $O_3$, a $HfO_2$ film is formed on the wafer W. For the case of using $Zr[N(CH_3)_2]_4$ and $O_3$, or $Zr[N(C_2H_5)_2]_4$ and $O_3$, a $ZrO_2$ film is formed on the wafer W. The processing gas or the cleaning gas may be supplied thereto by the shower head.

In the first to the seventh embodiments, TMA and $H_2O$, or $Hf(t-OC_4H_9)_4$ and $O_2$ is supplied sequentially. However, it is not necessarily limited to the sequence described herein. Further, TMA and $H_2O$, or $Hf(t-OC_4H_9)_4$ and $O_2$ may be supplied thereto at the same time and it is applicable to the gases described above in a same way.

In the first to the seventh embodiments, TMA, etc. is discharged by exhausting from an inside of the inner chamber 201. However, when exhausting from an inside of the inner chamber, a purge gas such as Ar and $N_2$ may be supplied into the inner chamber 201.

In the first to the seventh embodiments, as a substrate, the wafer W is used for an explaining thereof, however, there may be used a glass substrate for a liquid crystal display as the substrate.

In the first to the seventh embodiments, the substrate-processing apparatus 10 is used for explaining thereof. However, a physical vapor deposition processing apparatus (PVD processing apparatus) and a film forming apparatus such as a plating processing apparatus, an etching processing apparatus, or a chemical and mechanical polishing processing apparatus (CMP processing apparatus) may be used herein. Further, for the case of the etching processing apparatus, an etching gas can be supplied thereto alternatively or simultaneously.

INDUSTRIAL APPLICABILITY

The cleaning method and the substrate-processing apparatus in accordance with the present invention may be applied to a manufacturing industry of the semiconductor.

While the invention has been shown and described with respect to the preferred embodiments, it will be understood by those skilled in the art that various changes and modifications may be made without departing from the spirit and scope of the invention as defined in the following claims.

What is claimed is:

1. A method of cleaning a substrate processing apparatus, comprising the steps of:
    after processing a substrate placed in an inner chamber of the substrate processing apparatus, elevating a temperature of the inner chamber higher than that maintained while processing the substrate;
    exhausting a space between the inner chamber and an outer chamber that accommodates the inner chamber to maintain a pressure of the space to be lower than that outside the outer chamber;
    supplying a cleaning gas into the inner chamber; and
    removing substances to be cleaned off which are adhered to an inside of the inner chamber, while cooling the outer chamber.

2. The cleaning method of claim 1, wherein the outer chamber is made of metals.

3. The cleaning method of claim 1, wherein the cleaning gas is spread along a surface of a substrate-supporting member which supports the substrate accommodated into the inner chamber.

4. The cleaning method of claim 1, wherein the cleaning gas includes ketone.

5. The cleaning method of claim 4, wherein the ketone is β-diketone.

6. The cleaning method of claim 5, wherein β-diketone is hexafluoroacetylaceton.

7. The cleaning method of claim 1, wherein the temperature of the inner chamber is higher than that of the inner chamber when processing a substrate by more than or equal to 100° C.

8. The cleaning method of claim 1, wherein the inner chamber is made of quartz or ceramics.

9. The cleaning method of claim 1, wherein the substances to be cleaned off are oxides containing at least one element selected from the group consisting of Al, Y, Zr, Hf, La, Ce and Pr.

10. The cleaning method of claim 1, wherein the cleaning gas includes an active species.

11. The cleaning method of claim 1, wherein the cleaning method is performed while exhausting an inside of the inner chamber.

12. The cleaning method of claim 11, wherein the exhausting of the inside of the inner chamber is performed by using a different exhausting system from the exhausting system which is used for processing the substrate.

13. The cleaning method of claim 11, wherein the exhausting of the inside of the inner chamber is performed while collecting a by-product which is generated from a chemical reaction between the substances to be cleaned-off and the cleaning gas.

14. The cleaning method of claim 13, wherein the collecting of the by-product is performed at a position close to the inner chamber.

15. The cleaning method of claim 1, wherein the inner chamber is heated by a resistance heating element.

16. The cleaning method of claim 1, wherein the inner chamber is heated by a heating lamp.

17. The method of claim 1, wherein the exhausting of the space between the inner chamber and outer chamber begins before elevating the temperature of the inner chamber higher than that maintained while processing the substrate.

18. The method of claim 17, further comprising heating the inner chamber while cooling the outer chamber.

19. A substrate processing apparatus, comprising:
    an inner chamber;
    an outer chamber accommodating the inner chamber;
    a cleaning gas supplying unit for providing a cleaning gas to an inside of the inner chamber;
    a chamber heater for heating the inner chamber, the chamber heater being installed between the inner chamber and the outer chamber; and
    an exhaust unit for exhausting a space between the inner chamber and the outer chamber to maintain a pressure of the space to be lower than that outside the outer chamber.

20. The substrate-processing apparatus of claim 19, further comprising a reflecting body which guides a heat ray into the inner chamber, the heat ray being irradiated from the chamber heater.

21. The substrate processing apparatus of claim 19, wherein the outer chamber is made of metals.

22. The substrate processing apparatus of claim 19, further comprising:

a cooling unit for cooling the outer chamber, the cooling unit being installed to the outer chamber.

* * * * *